United States Patent [19]

Takahashi

[11] Patent Number: 5,793,100
[45] Date of Patent: Aug. 11, 1998

[54] LEAD FRAME FOR SEMICONDUCTOR DEVICE

[75] Inventor: Yoshiharu Takahashi, Tokyo, Japan

[73] Assignee: Mitsubishi Denki Kabushiki Kaisha, Tokyo, Japan

[21] Appl. No.: 584,124

[22] Filed: Jan. 11, 1996

[30] Foreign Application Priority Data

Feb. 2, 1995 [JP] Japan .................. 7-015916

[51] Int. Cl.[6] .................. H01L 23/495
[52] U.S. Cl. .................. 257/669; 257/670; 257/674
[58] Field of Search .................. 257/669, 674, 257/670

[56] References Cited

U.S. PATENT DOCUMENTS

| | | |
|---|---|---|
| 4,400,714 | 8/1983 | Brown .................. 257/669 |
| 4,625,227 | 11/1986 | Hara et al. .................. 257/669 |
| 4,721,993 | 1/1988 | Walter .................. 257/669 |
| 4,797,726 | 1/1989 | Manabe .................. 257/669 |
| 4,918,511 | 4/1990 | Brown .................. 257/669 |
| 5,023,699 | 6/1991 | Hara et al. .................. 257/669 |
| 5,338,972 | 8/1994 | Negoro .................. 257/669 |

FOREIGN PATENT DOCUMENTS

| | | | |
|---|---|---|---|
| 0293970 | 12/1988 | European Pat. Off. .................. 257/669 |
| 57-62549 | 4/1982 | Japan .................. 257/669 |
| 58-21362 | 2/1983 | Japan .................. 257/669 |
| 59-177953 | 10/1984 | Japan .................. 257/669 |
| 60-121751 | 6/1985 | Japan .................. 257/669 |
| 61-71655 | 4/1986 | Japan . |
| 61-104650 | 5/1986 | Japan . |
| 61-188951 | 8/1986 | Japan .................. 257/669 |
| 62-23139 | 1/1987 | Japan . |
| 2137252 | 5/1990 | Japan . |
| 2273962 | 11/1990 | Japan . |
| 496261 | 3/1992 | Japan . |
| 4188859 | 7/1992 | Japan . |
| 5-55430 | 3/1993 | Japan .................. 257/669 |
| 5121624 | 5/1993 | Japan . |
| 5175396 | 7/1993 | Japan . |

*Primary Examiner*—David Ostrowski
*Attorney, Agent, or Firm*—Leydig, Voit & Mayer, Ltd.

[57] ABSTRACT

A lead frame includes first slits in a lead frame edge in a direction parallel to a longitudinal direction of the lead frame edge at spaced intervals and a plurality of slits in the lead frame edge in a direction parallel to the first slits at spaced intervals so that the second slits are separated from the first slits wherein each end of each of the second slits is located near the center of a corresponding first slit.

18 Claims, 31 Drawing Sheets

11

LEAD FRAME FOR SEMICONDUCTOR DEVICE

BACKGROUND OF THE INVENTION

1. Field of the Invention

The present invention relates to a lead frame which can absorb thermal deformation occurring in a lead frame in assembling a semiconductor device and can be accurately assembled at high precision, and to a semiconductor device using the lead frame.

2. Prior Art

FIGS. 32 and 33 show lead frames each having a conventional distortion absorber described in, e.g., Japanese Unexamined Patent Publication No. 2-273962. In the prior art, slits 1c are formed in two parallel lead frame edges 1 and section bars 2A and 2B in a direction perpendicular to an external lead and directions parallel to the lead frame edges 1 and the section bars 2A and 2B, respectively. The slits 1c are not formed in portions where the lead frame edges 1 are perpendicular to the section bars 2A and 2B.

FIGS. 34 and 35 show lead frames each having a distortion absorber described in, e.g., Japanese Unexamined Patent Publication No. 61-71655. FIGS. 36 and 37 show lead frames each having a thermal distortion absorber described in, e.g., Japanese Unexamined Patent Publication No. 61-104650.

In the assembling step, e.g., the wire bonding step, a lead frame is heated to a temperature ranging between 200°±50° C. to bond gold wires to the lead frame by thermal compression bonding. In the solder die bonding step serving as the previous step, the lead frame is also heated to a temperature ranging from room temperature to 400° C. In the resin die bonding step, the lead frame is heated to a curing temperature. At this time, the lead frame cannot be easily heated so as to make the temperature of the overall lead frame uniform because of the mechanical limit on a device to be manufactured. For example, since a heat block for heating a lead frame is designed in such a manner that a bonding portion is set at a predetermined temperature, the temperature of the bonding point is set as the highest temperature, and the heat block has temperature differences, as shown in FIGS. 41 and 43, in the longitudinal direction of the lead frame with reference to the bonding point. For this reason, temperature differences indicated by C, D, F, and G in FIG. 40 occur because the lead frame passes over the heat block having temperature differences indicated by A and B in FIG. 40 in the longitudinal direction of the lead frame. In addition, before the lead frame entirely passes over the heat block, each portion of the overall lead frame passes over portions having temperatures shown in FIG. 40, and the lead frame has a complex heat history in the longitudinal direction of the lead frame in such a manner that the highest-temperature point moves on the frame. These temperature differences are shown in FIGS. 40 and 43.

The heat block can be designed to have on a width smaller than the cross dimension of the lead frame. This is because the two parallel outermost peripheral portions of the frame edges in the cross direction of the frame are supported by a conveying mechanism when the frame is conveyed, so that the heat block cannot be arranged at these portions. For this reason, the heat differences, as shown in FIGS. 41 and 42, occur in the cross direction of the lead frame. These heat differences inevitably occur in the lead frame in its cross direction.

For example, in the lead frames (FIGS. 32 and 33) described in Japanese Unexamined Patent Publication No. 2-273962, no slits are formed in portions where section bars 1a and 1b and the two lead frame edges 1 meet. For this reason, the following problems are posed. That is, a temperature difference in the longitudinal direction of the lead frame cannot be absorbed, and thermal distortion due to a temperature difference in the cross direction of the lead frame cannot be sufficiently absorbed.

In the lead frames (FIGS. 34, 35, 36, and 37) described in Japanese Unexamined Patent Publication Nos. 61-104656 and 61-71655, even if thermal distortion in the longitudinal direction of the frame can be absorbed, a temperature difference in the cross direction of the lead frame cannot be absorbed. For this reason, since the lead frame cannot be increased in width especially, a matrix frame which is not deformed by the heat history in the assembling step and from which a large number of lead frames can be formed cannot be manufactured.

FIGS. 38 and 39 show measurement points used when the temperatures of lead frames placed on a heat block 10 are measured. Referring to FIGS. 38 and 39, reference symbols C and G denote cross-direction measurement positions on the lead frame edge 1; F and D, cross-direction measurement positions on a die pad 5 on the lead frame; E, a cross-direction measurement position on a horizontal section bar 2c on the lead frame; and A and B, cross-direction measurement positions on the heat block. Reference numerals 1 to 11 denote longitudinal-direction temperature measurement positions (on A and B) on the heat block. Also, reference numerals 4 to 11 denote longitudinal-direction temperature measurement positions on the lead frame (on C, D, E, F, and G).

FIG. 40 shows actual temperatures measured at the positions A, B, C, D, E, F, and G. The actual temperatures at the positions 4 to 11 in the longitudinal direction of the lead frame shown in FIGS. 38 and 39 are represented by C, D, E, F, and G, respectively, and the temperatures at the positions A and B in the transverse direction on the heat block are represented by 1 to 10 plotted in the longitudinal direction.

FIG. 41 shows the cross-direction temperature distribution of the position 7 shown in FIGS. 38 and 39. Reference symbols C, D, E, F, and G in FIG. 41 denote temperatures measured at the cross-direction measurement positions. FIG. 42 shows the cross-direction temperature distributions of the remaining positions 4 to 11. FIG. 43 shows the measured temperature distributions of the positions 4 to 11 at the position E in the cross direction of the lead frame. FIG. 44 shows a thermal deformation state obtained when such temperature distributions occur in the lead frame (FIGS. 32 and 33) described in, e.g., Japanese Unexamined Patent Publication No. 2-273962.

Referring to FIG. 44, assume that there is a temperature difference in the longitudinal direction of the lead frame, and that a portion corresponding to the section bar 2A has a temperature higher than that of a portion corresponding to the section bar 2B. In this case, considering the rectangular frame surrounded by the section bar 2A, the section bar 2B, and the lead frame edges 1, expansion of the section bar 2A caused by heat is greater than that of the section bar 2B caused by heat. For this reason, the shape of the rectangular frame is deformed into a trapezoidal shape as indicated by an alternate long and short dash line in FIG. 44. More specifically, when there is a temperature difference in the longitudinal direction of the lead frame, the quadrilateral frame surrounded by the section bars 2A and 2B and the two parallel lead frame edges 1 is displaced so as to be deformed into the trapezoidal shape as indicated by the alternating long and short dash line in FIG. 44.

Similarly, referring to FIG. 44, when there is a temperature difference in the cross direction of the lead frame, the quadrilateral frame has a temperature distribution which is expressed by a high-order polynomial in such a manner that the portions corresponding to the lead frame edges 1 have low temperature and that the central portions of the two parallel lead frame edges 1 have the highest temperature, and displacement depending on the temperature distribution occurs. More specifically, the quadrilateral frame is displaced so as to be deformed into a drum like shape.

In the lead frame (FIGS. 32 and 33) in Japanese Unexamined Patent Publication No. 2-273962, the slits 1c are formed throughout the range in which an external lead is arranged. For this reason, since the thermal displacement of the end portion of the external lead cannot be escaped, the external lead cannot sufficiently absorb displacement in an X-axis direction. In addition, since a portion 1a having low rigidity is arranged at a portion where no displacement occurs, the portion 1a cannot absorb the displacement, and a portion indicated by 1b is rather deformed. In this prior art, the section bars 2A and 2B and the lead frame edges 1 are connected to each other to form a quadrilateral shape, thereby constraining the section bars 2A and 2B and the lead frame edges 1 to each other. For this reason, deformation into a trapezoidal shape is not absorbed. Therefore, as thermal deformation caused by a temperature difference in the longitudinal direction of the lead frame, displacement disadvantageously occurs in a Z-axis direction being, perpendicular to X and Y axes, which affects the plane of the lead frame.

In the prior art (FIGS. 34 and 35) described in Japanese Unexamined Patent Publication No. 61-71655, although the quadrilateral shape is constituted by the parallel upper and lower lead frame edges 1 and the tie bars, drum-shaped displacement caused by the temperature difference in the cross direction cannot be absorbed because a low-rigidity portion is formed at a portion located outside the quadrilateral shape. Displacement in a trapezoidal deformation mode caused by a temperature difference in an axial direction also cannot be absorbed.

In the prior art (FIGS. 36 and 37) described in Japanese Unexamined Patent Publication Nos. 61-104650, as in the prior art (FIGS. 34 and 35) described in Japanese Unexamined Patent Publication No. 61-71655, deformation in the trapezoidal deformation mode and a drum-shaped deformation mode cannot be absorbed.

SUMMARY OF THE INVENTION

The present invention has been made to solve the problems in the prior arts described above, and has as its object to provide a lead frame which can simultaneously absorb thermal deformation occurring in the lead frame in the assembling step for a semiconductor device, i.e., thermal distortion caused by a temperature difference in the longitudinal direction of the lead frame, and thermal distortion caused by a temperature difference in the cross direction of the lead frame. It is another object of the present invention to solve the problem of the thermal distortion in the cross direction of the lead frame so as to provide a matrix lead frame which has a large cross dimension and from which a large number of lead frames can be formed. It is still another object of the present invention to provide a semiconductor device using such a lead frame.

A lead frame according to this invention is arranged as follows. That is, slits are formed in a direction perpendicular to the directions of thermal deformation caused by a temperature difference in the longitudinal direction of the lead frame and thermal deformation caused by a temperature difference in the cross direction of the lead frame, and each slit has a predetermined length. Members which are thermally deformed are continuously arranged near the central portion area of the slit, and members having low-rigidity portions which are obtained by partially dividing the members by the slit and which are thermally deformed are continuously arranged, so as to arrange a member which is deformed in a displacement direction of a both-end-supported beam, a both-end-fixed beam, or a cantilevered beam. The longitudinal direction of the beam is caused to correspond to the longitudinal direction of the slit, thereby absorbing thermal distortion.

More specifically, according to the present invention, a lead frame comprises a plurality of first slits formed in a lead frame edge in a direction parallel to a longitudinal direction of the lead frame edge at predetermined intervals, and a plurality of second slits formed in the lead frame edge in a direction parallel to the first slits at predetermined intervals in such a manner that the second slits are separated from the first slits by predetermined intervals, wherein each end portion of each of the second slits is located at a position near the center of each of the first slits.

According to the present invention, a lead frame comprises a plurality of first slits formed in a section bar in a direction parallel to a cross direction of a lead frame at predetermined intervals, and a plurality of second slits formed in the lead frame edge in a direction parallel to the first slits at predetermined intervals in such a manner that the second slits are separated from the first slits by predetermined intervals, wherein each end portion of each of the second slits is located at a position near the center of each of the first slits.

According to the present invention, in a lead frame in which a section bar and a die pad suspension lead are formed to be connected to a lead frame edge, a plurality of first slits and a plurality of second slits having each end portion which is located near the center of each of the first slits are formed in portions where the second bar and the die pad suspension lead are connected to the section bar.

According to the present invention, in a lead frame in which a plurality of section bars and a plurality of die pad suspension leads are arranged through an intermediate edge in a cross direction of lead frame edges, a plurality of first slits which are formed in a direction parallel to a longitudinal direction of the intermediate edge and a plurality of second slits which are formed in a direction parallel to the first slits at predetermined intervals in such a manner that the second slits are separated from the first slits by predetermined intervals are formed in the intermediate edge, and each end portion of each of the second slits is located at a position near the center of each of the first slits.

According to the present invention, a slit is formed in each of the section bars in a direction perpendicular to the first and second slits.

According to the present invention, in a lead frame in which a plurality of section bars and a plurality of die pad suspension leads are arranged through an intermediate edge in a cross direction of lead frame edges, at least two lines of slits are formed in the intermediate edge in a longitudinal direction thereof, and a slit being perpendicular to the two lines of slits is formed between the two lines of slits.

According to the present invention, the slit which is formed perpendicular to the two lines of slits therebetween is formed on the same line as that of a cutting slit formed in each of the section bars.

According to the present invention, in a lead frame in which a plurality of section bars and a plurality of die pad suspension leads are arranged through an intermediate edge in a cross direction of lead frame edges, at least two lines of slits are formed in the intermediate edge in a longitudinal direction thereof, and a slit which is partially perpendicular to and parallel to the two lines of slits is formed between the two lines of slits.

According to the present invention, in a lead frame in which a section bar and a die pad suspension lead are formed to be connected to a lead frame edge, a slit which is partially perpendicular to the die pad suspension lead is formed in a die pad.

According to the present invention, in a lead frame in which a section bar and a die pad suspension lead are formed to be connected to a lead frame edge, two parallel slits being perpendicular to a die pad suspension lead are formed in the lead frame edge, and a slit being perpendicular to the die pad suspension lead is formed in a die pad.

According to the present invention, in a lead frame in which a section bar and a die pad suspension lead are formed to be connected to a lead frame edge, two parallel slits being perpendicular to a die pad suspension lead are formed in the section bar, and a slit being perpendicular to the die pad suspension lead is formed in a die pad.

According to the present invention, in a lead frame in which a section bar and a die pad suspension lead are formed to be connected to a lead frame edge, wherein a right-angle slit in which a portion being parallel to the lead frame edge and a portion being parallel to the section bar are connected to each other through a perpendicular portion and a parallel slit being parallel to the lead frame edge are formed in the lead frame edge, and an end portion of the parallel slit is located near the perpendicular portion of the right-angle slit.

According to the present invention, in lead frame, having a horizontal member and a vertical member, for a semiconductor, at least four portions each of which is designed to cross the vertical member near a central portion of a slit formed in the horizontal member are arranged.

According to the present invention, in a lead frame, having a horizontal member and a vertical member, for a semiconductor, at least four portions each having a T-shaped slit which is formed in such a manner that a vertical slit formed in the vertical member perpendicularly crosses a slit formed in the horizontal member near a central portion of the slit formed in the horizontal member are arranged.

According to the present invention, in a lead frame, having a horizontal member and a vertical member, for a semiconductor, at two four portions each of which is designed to cross the vertical member near a central portion of a slit formed in the horizontal member are arranged, and at least two portions each having a T-shaped slit which is formed in such a manner that a vertical slit formed in the vertical member perpendicularly crosses a slit formed in the horizontal member near a central portion of the slit formed in the horizontal member are arranged.

According to the present invention, a lead frame, having a horizontal member and a vertical member, for a semiconductor, wherein a double slit having a predetermined length is formed in the horizontal member at a crossing point between the horizontal member and the vertical member, a first slit of the double slit is formed to cross the vertical member near a central portion of the fist slit, and a second slit is formed in such a manner that one end of the second slit is located near a portion where the first slit crosses the vertical member.

A semiconductor device according to the present invention is manufactured such a lead frame and includes part of the lead frame. For this reason, reliability with respect to heat is improved.

In a lead frame according to the present invention, thermal distortion caused by a temperature difference in the longitudinal direction of the lead frame is absorbed by a slit formed in a frame edge portion, and thermal distortion caused by a temperature difference in the cross direction of the lead frame is absorbed by a slit formed in a section bar portion. Since the lead frame according to the present invention can absorb the thermal distortion caused by the temperature difference in the longitudinal direction of the lead frame and the thermal distortion caused by the temperature difference in the cross direction of the lead frame, the cross and longitudinal dimension of the lead frame are not limited by thermal distortion, and a so-called matrix lead frame in which lead frames are arranged in a large number of rows and a large number of lines can be provided at a high accuracy. Since a semiconductor device according to the present invention is manufactured by using such a lead frame and includes part of the lead frame, reliability with respect to heat is improved.

DESCRIPTION OF THE PREFERRED EMBODIMENTS

Embodiment 1

Figure 1:
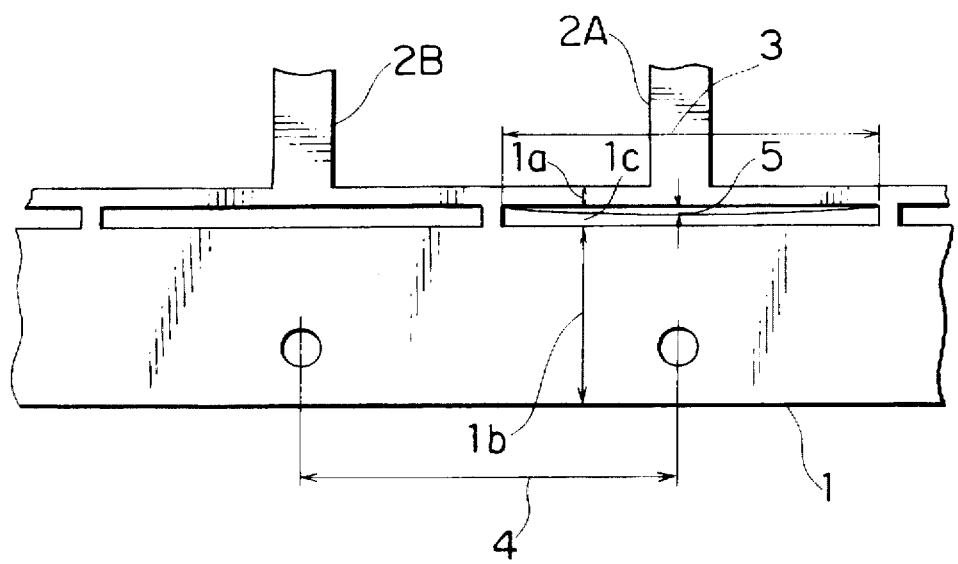
FIG. 1 is a partial plan view showing a lead frame according to Embodiment 1 of the present invention.

As shown in FIG. 1 section bars 2A and 2B extend from a lead frame edge 1. A slit 1c extending in a direction parallel to the longitudinal direction of the lead frame edge 1 is formed in each of portions where the lead frame edge 1 is connected to the section bars 2A and 2B. The slit 1c has a longitudinal dimension 3. The slit 1c divides the lead frame edge 1 into a low-rigidity portion 1a and a high-rigidity portion 1b.

Reference holes are formed in the lead frame edge 1 at intervals 4. Each of the section bars 2A and 2B is expanded by heat to have an additional length 5.

Figure 2:
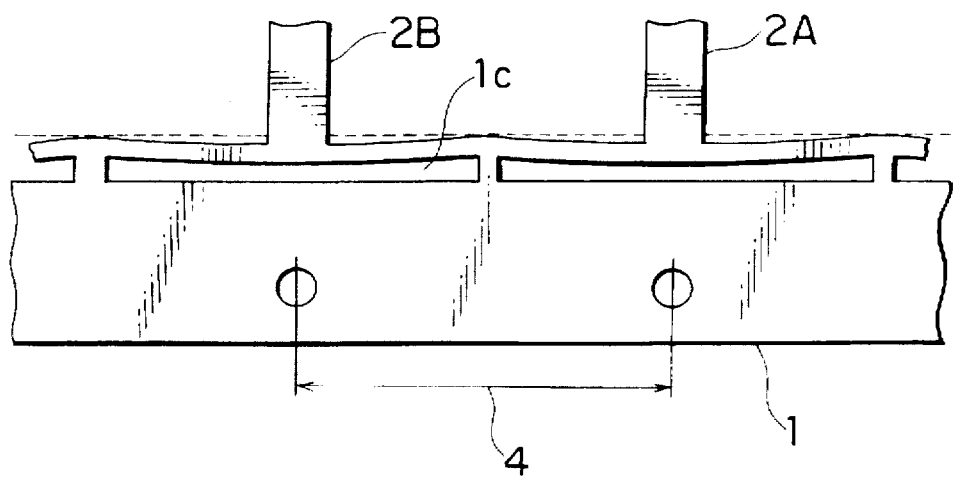
FIG. 2 is a partial plan view showing Embodiment 1.
Figure 3:
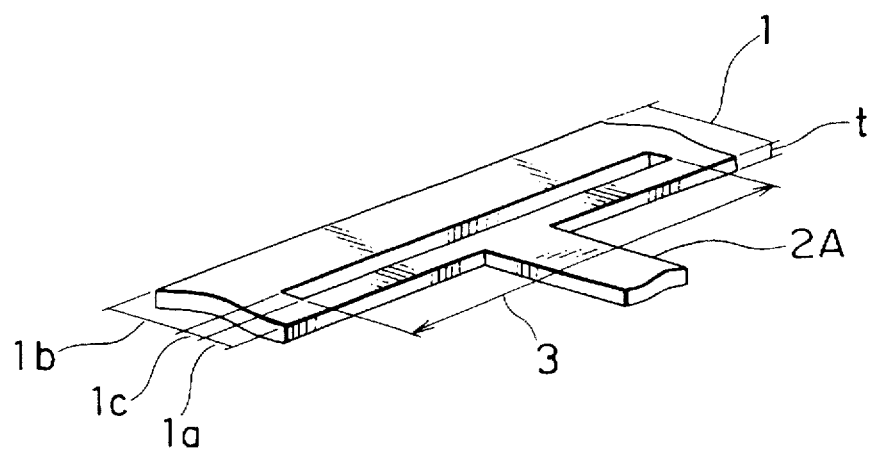
FIG. 3 is an enlarged perspective view showing the slit shown in FIG. 1.
Figure 4:
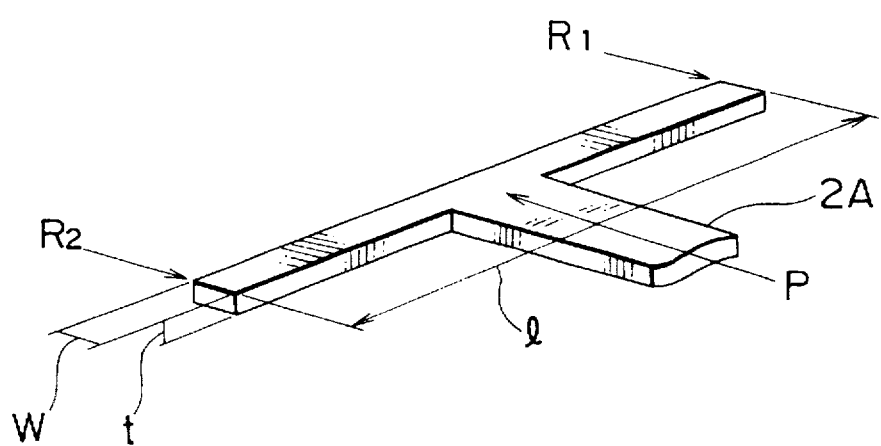
FIG. 4 is a perspective view for explaining a load support state of a low-rigidity portion constituted by a slit according to this embodiment.

FIG. 2 is a view showing a simulated deformation mode showing a manner in which, when the section bars 2A and 2B shown in FIG. 1 are thermally deformed (see reference numeral 5 in FIG. 1), thermal deformation is absorbed. FIG. 3 is a view showing a load of the both-end-supported beam of the lead frame and a deformation state of the lead frame. Referring to FIG. 3, a load in a direction perpendicular to the longitudinal direction of the lead frame edge 1 acts on the lead frame edge 1 when the section bar 2A is expanded by a change in temperature. At this time, when the slit is formed, a portion on which a load generated by the section bar 2A directly acts is expanded. FIG. 4 shows a load of a both-end-supported beam of the lead frame and a deformation state of the lead frame. FIG. 4 shows the modeled relationship between a load P and support forces R1 and R2 at the portion which is shown as an enlarged view in FIG. 3 and which is directly supported when the load P in the direction perpendicular to the longitudinal direction of the lead frame edge 1 when the section bar 2A is expanded by a change in temperature.

The slit is formed in each of the portions where the lead frame edge 1 is perpendicular to the section bars 2A and 2B to have the longitudinal dimension indicated by 3 in FIG. 1, and the lead frame edge 1 is divided into the low-rigidity portion 1a and the high-rigidity portion 1b. Each of the section bars 2A and 2B extends from the low-rigidity portion 1a near a portion near the central portion of the longitudinal dimension 3 of the slit 1c so as to be perpendicular to the low-rigidity portion 1a. When there is a temperature difference in the longitudinal direction of the lead frame edge 1, the section bars 2A and 2B have different amounts of expansion. For this reason, if the section bar 2A has a temperature higher than that of the section bar 2B, as shown in FIG. 1, the section bar 2B is not displaced, but the section bar 2A extends by an amount of expansion indicated by 5 in FIG. 1. For this reason, as indicated by a broken line in FIG. 2, the low-rigidity portion 1a is deformed throughout the overall longitudinal dimension 3 of the slit 1c. At this time, even if the interval 4 between the reference holes in the lead frame edge 1 is influenced, the influence is very small. That is, a portion corresponding to the longitudinal dimension 3 of the slit 1c of the low-rigidity portion 1a absorbs thermal deformation (see reference numeral 5).

Figure 5:
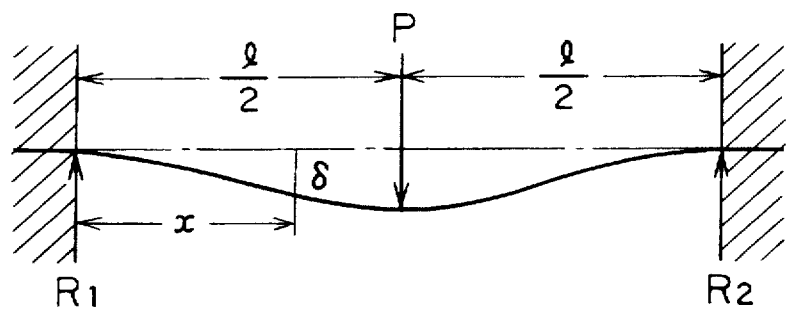
FIG. 5 is a model for explaining a load support state and displacement according to this embodiment.

Thermal deformation $\delta$ occurring at this time will be described below with reference to FIG. 5. In a model equivalent to the model as shown in FIGS. 3 and 4, when the longitudinal dimension 3 of the slit 1c is represented by l, a deformation mode shown in FIG. 5 is produced. When the thickness of a lead frame edge 1 is represented by t, and the width of the low-rigidity portion 1a is represented by w, an amount of thermal deformation (see FIG. 5) is equivalent to the thermal deformation $\delta$. When the amount of thermal deformation (see reference numeral 5) =δ, a force expressed by $P=192 \cdot E \cdot I \cdot \delta/l^3$ acts on the connection portions between the low-rigidity portion 1a and the section bars 2A and 2B. In the equation for P, reference symbol E denotes a longitudinal elastic coefficient of the lead frame edge 1, and is a mechanical characteristics depending on the material constituting the lead frame edge 1. Since reference symbol I denotes a sectional secondary moment determined by the dimension of the low-rigidity portion 1a, and is expressed by $I=t \cdot w^3/12$, $F=16 \cdot E \cdot t \cdot w^3 \cdot \delta/l^3$ is established. Therefore, when the thermal deformation δ occurs, in order to decrease the force P acting on the portion near the central portion of the longitudinal dimension (see reference numeral 3) of the low-rigidity portion 1a obtained by dividing the lead frame edge 1, 1, i.e., the length (see reference numeral 3) of the slit 1c must be increased, or the cross dimension (see reference symbol w in FIG. 4) of the low-rigidity portion 1a must be decreased.

The longitudinal dimension 3 of the slit 1c according to this embodiment is preferably as large as possible. The width of the low-rigidity portion 1a is preferably as small as possible within the range in which the slit 1c can be processed by a punching frame or an etching frame. The transverse dimension of the slit 1c must be set to be larger than the amount of deformation (see reference numeral 5) produced by thermal deformation. The longitudinal dimension of the slit 1c can be arbitrarily set to a value produced by the highest-temperature difference with respect to the longitudinal direction of the lead frame edge 1. Therefore, the degree of freedom of designs for lead frames is improved.

Figure 6:
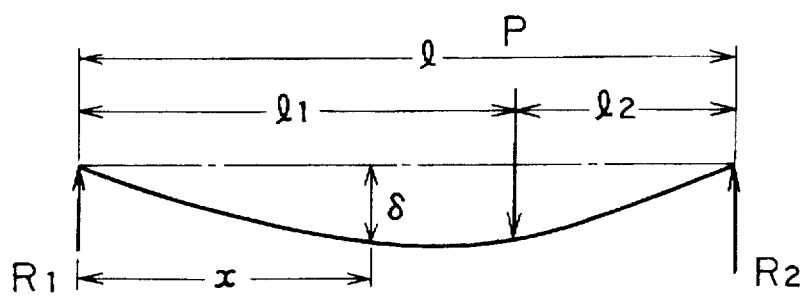
FIG. 6 is a model for explaining a load support state and displacement according to this embodiment.
Figure 7:
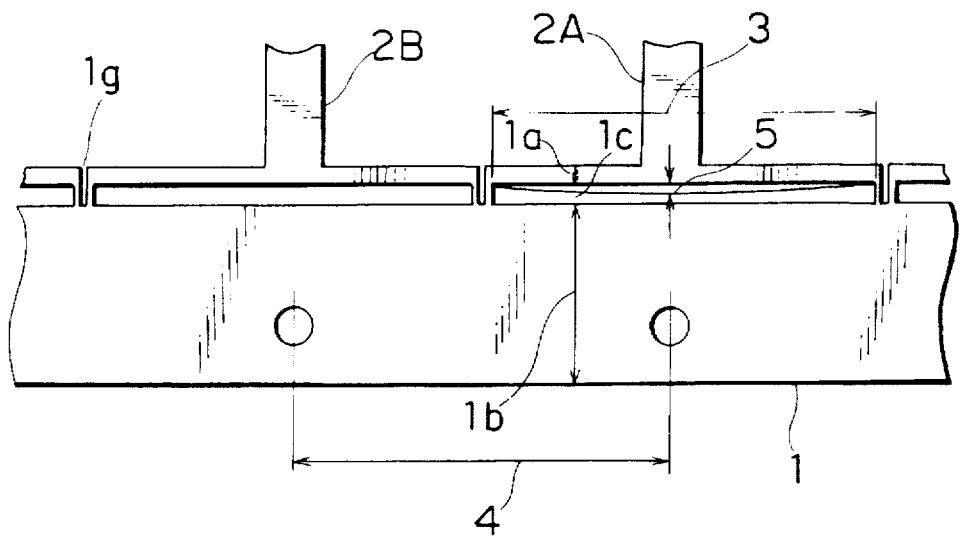
FIG. 7 is a plan view showing a modification of this embodiment.
Figure 8:
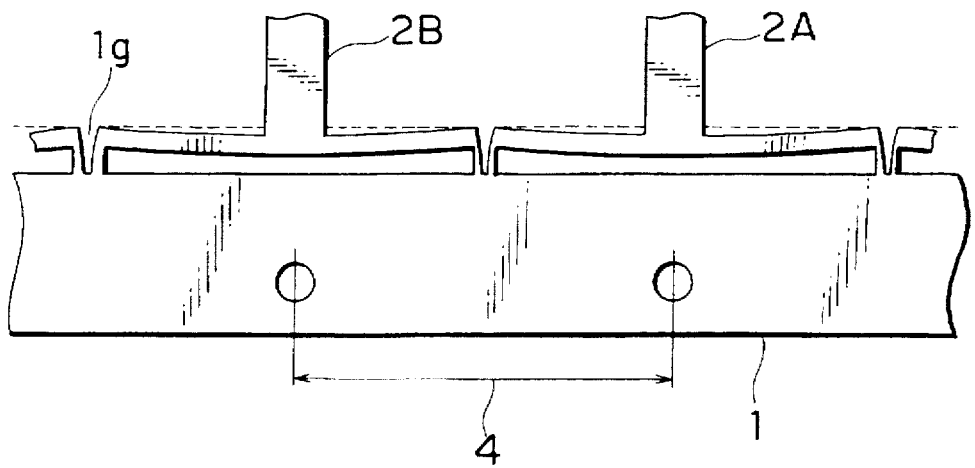
FIG. 8 is a plan view showing a modification of this embodiment.

FIG. 2 is a view showing a simulation of thermal deformation which actually occurs. Assume that the longitudinal dimension 3 of the slit 1c is large, and that the interval between the slits 1c is decreased. In this case, when constraint becomes weak, FIG. 6 shows a both-end-support mode. For this reason, FIG. 6 shows the deformation mode of a portion having the thickness t and the longitudinal dimension 3 by using the low-rigidity portion 1a at that time. Referring to FIG. 6, when the longitudinal dimension 3 of the slit 1c is set to be large, and the interval between the slits 1c is decreased, $P=48 \cdot EI/l^3=4E \cdot t \cdot w^3/l^3$ is established, and thermal deformation is more easily absorbed. At this time, as shown in FIGS. 7 and 8, when a slit 1g is formed between each pairs of slits 1c, perpendicular thereto, this effect is more conspicuous. Due to the slit 1g shown in FIGS. 7 and 8, the intervals (indicated by reference numeral 4 in FIGS. 7 and 8) between the reference holes are not influenced by the thermal deformation of the section bars 2A and 2B. For this reason, while accuracy is kept high, the operations of the assembling step can be performed, and highly accurate semiconductor devices can be manufactured.

Figure 9:
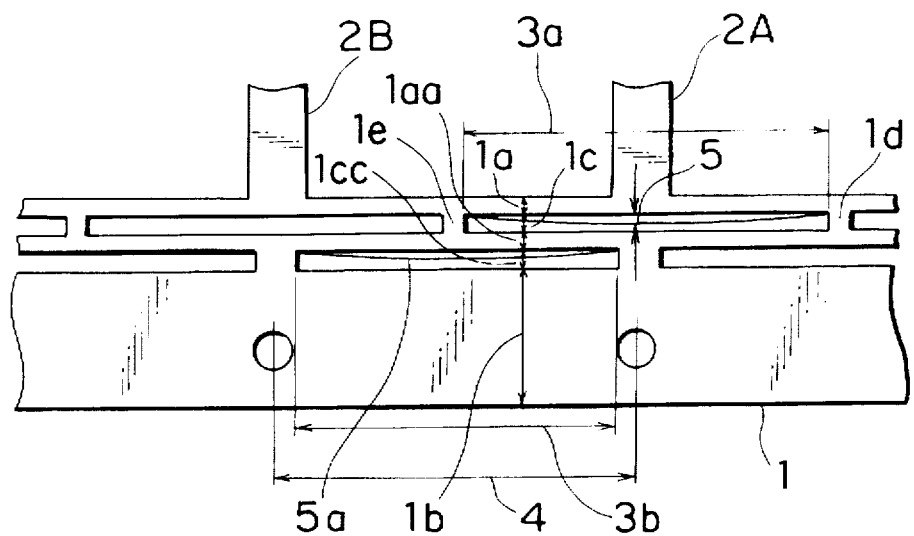
FIG. 9 is a plan view showing a double slit according to a modification of this embodiment.

A modification of this embodiment will be described below. Referring to FIG. 9, reference numeral 1 denotes a lead frame edge; 2A and 2B, section bars; and 1c, a slit formed in the lead frame edge 1. Reference numeral 1cc denotes a slit which is formed outside the slit 1c parallel to the slit 1c in such a manner that the central portion of the slit 1c in the longitudinal direction is located at one end portion of the slit 1cc. Referring to FIG. 9, reference numeral 3a denotes the length of the slit 1c; 3b, the length of the slit 1cc; 1a, a low-rigidity portion obtained by dividing the lead frame edge 1 by the slit 1c; 1aa, a low-rigidity portion interposed between the slit 1c and the slit 1cc in the lead frame edge 1; 5, an amount of deformation produced by thermal deformation of the section bar 2A of the low-rigidity portion 1a; and 5a, displacement occurring in such a manner that thermal displacement occurring in the section bars 2A and 2B is transmitted through the portion interposed between the slits 1c.

Figure 10:
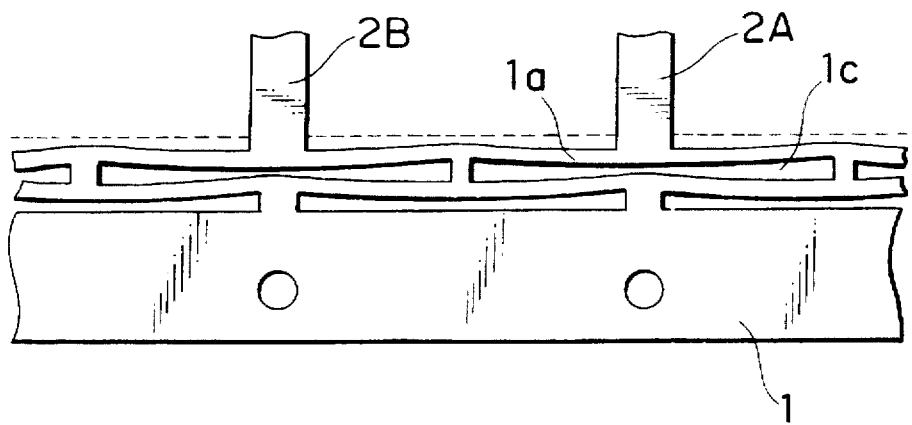
FIG. 10 is a plan view showing a mode of deformation of a horizontal member occurring when thermal deformation occurs in the modification in FIG. 9.

FIG. 10 is a view obtained by simulating the mode of displacement producing a temperature difference in the longitudinal direction of the lead frame edge 1. In this embodiment, as shown in FIG. 9, in the regions where the lead frame edge 1 is perpendicular to the section bars 2A and 2B, the section bars 2A and 2B are perpendicular to the low-rigidity portion 1a near the almost central portions of the slits 1c in the longitudinal direction.

The end portions of the slits are located at positions separated by the cross dimension 1aa of the second low-rigidity portion, and are located near the almost central portion of the length 3b of the second slit.

The low-rigidity portion 1a in FIG. 9 is equivalent to the model shown in FIG. 4 when w=1a and l=3a, and the low-rigidity portion 1a is displaced by δ shown in FIG. 5. On the other hand, the low-rigidity portion 1aa in FIG. 9 is the model shown in FIG. 4. When a cross dimension satisfies w=1aa, and a longitudinal dimension satisfies l=3b, the low-rigidity portion 1aa is equivalent to the model shown in FIG. 4, and the low-rigidity portion 1aa is displaced by δ shown in FIG. 5. Therefore, displacement shown in FIG. 10 occurs.

Figure 11:
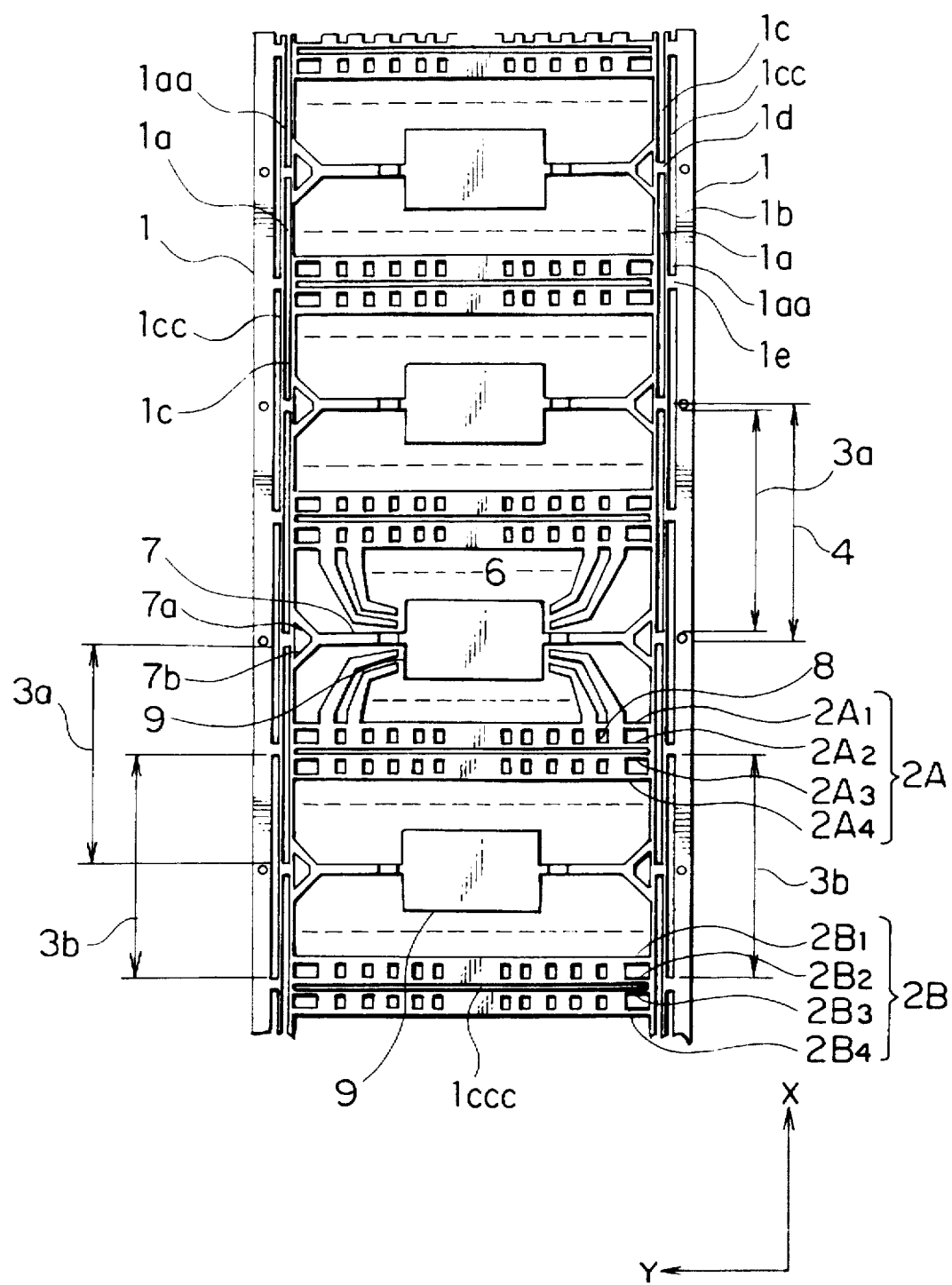
FIG. 11 is a plan view showing a lead frame according to Embodiment 2 of the present invention.

Referring to FIG. 11, a rectangular portion surrounded by the portions of the lead frame edges 1 and the section bars 2A and 2B keeps its rectangular shape when the lead frame is kept at room temperature throughout the overall length and width. When the lead frame is conveyed onto a heat block and then heated to the temperature of the heat block, and the section bars 2A and 2B have a temperature difference, the amounts of expansion of the section bars 2A and 2B are different from each other. When this difference is produced, the rectangular portion surrounded by the portions of the lead frame edges 1 and the section bars 2A and 2B are deformed into a trapezoidal portion.

This embodiment is made to absorb the difference which is produced between the amounts of expansion of the section bars 2A and 2B when the rectangular portion is deformed into the trapezoidal portion. This embodiment has an arrangement in which a portion having low rigidity in the direction of expansion is formed in the lead frame edge portion. The embodiment is characterized in that a plurality of slits are formed in the lead frame edge portions to which the section bars 2A and 2B are perpendicularly connected.

Referring to FIG. 1, a slit shown in FIG. 1 and having a width of 1c and a length of 3 is formed in a portion where the frame edge is perpendicular to and to the section bar 2A. At this time, the section bar is located at the central portion of the slit, and the slit 1c is formed parallel to the lead frame edge 1 in such a manner that the overall cross dimension of the lead frame edge 1 is divided into the widths of the portions 1a and 1b. When the slit is formed as described above, as shown in FIGS. 3 and 4, displacement of the section bar 2A caused by heat is converted into the problem of a both-end-fixed beam shown in FIG. 5 and being equivalent to centrally concentrated load beam having both ends which are fixed. At this time, since the depth dimension of the beam corresponds to 1a when the thickness of the lead frame is T, the sectional secondary moment I of the beam is expressed by the following equation:

$$I=T \times (1a)^3/12$$

In this equation, $(1a)^3$ expresses a position where a slit is formed to influence the sectional secondary moment. More specifically, the method of arranging and designing the low-rigidity portion 1a and the high-rigidity portion 1b obtained by dividing the lead frame edge 1 with the slit 1c must be performed with the great care. Although the slit 1c and the portion 1a have the same dimension in FIG. 1, in order to decrease the rigidity of the portion 1a, the dimension of the portion 1a is advantageously decreased to the minimum dimension which can be processed by an etching process or a punching process in making the lead frame.

A method of forming a double slit which is more effective by absorbing an amount of deformation caused by thermal deformation of a section bar, and the operation and effect thereof will be described below with reference to FIG. 9. The method of forming the first slit, and the operation and effect thereof are omitted because they have been described with respect to FIG. 1. As shown in FIG. 9, the second slit is formed in such a manner that the end portion of the first slit is located near the central portion of the length 3b of the second slit. At this time, a dimension 1aa between the first and second slits causes the same operation and effect as those of the dimension 1a which is important when the first low-rigidity portion described in the formation of the first slit is formed. A both-end-fixed beam having a longitudinal dimension 3b and a width equal to the width 1aa of the second low-rigidity portion, i.e., the second low-rigidity beam, which is formed by the second slit, of the lead frame is arranged.

With respect to the effect of the double slit formed as described above, a deformation mode is shown in FIG. 10. More specifically, referring to FIG. 9, the both-end-fixed beam having the length 3a and a width equal to the width of the first low-rigidity portion 1a has bending 5 in FIG. 9. The both-end-fixed beam having the length 3b and a width equal to the width of the first low-rigidity portion 1 aa has bending 5a in FIG. 9. As a result, the sum of both the bendings 5 and 5a absorbs an amount of expansion occurring when the section bar 2A is expanded by thermal displacement.

A deformation state when one slit is formed is shown in FIG. 2. Referring to FIG. 2, the state before deformation is indicated by a dotted line. As is apparent from comparison between the deformation mode in FIG. 10 and the deformation mode in FIG. 2, the amount of deformation in the deformation mode shown in FIG. 10 is larger 15 than that in the deformation mode shown in FIG. 2 by an amount of deformation 5a (see FIG. 9) produced by the second slit. This is because, when the second both-end-fixed beam having a central portion which is concentrically loaded is displaced by 5, the fixed portions of the first both-end-fixed beam having a central portion which is concentrically loaded are shifted by the same amount as the amount of displacement of the first both-end-fixed portion. In this manner, according to the present invention, a third slit may be additionally formed, or four or more slits can be formed.

However, in order to achieve the objects of the present application, as condition 1, a slit must be formed in a horizontal member, i.e., a member parallel to the lead frame edge 1 in the above description, such as a portion where the lead frame edge 1 is perpendicular to and to the section bar in the above description. As condition 2, the portion where the lead frame edge 1 is connected to the section bar must be located near the central portion of the slit. As condition 3, the transverse dimension of the low-rigidity portion of the horizontal member which is partially divided by the slit must be designed and determined in such a manner that a target sectional secondary moment is obtained. As collateral condition 4, an end portion of the first slit is located near the central portion of a second slit. As a collateral condition, an end portion of the (N−1)th slit must be located near the central portion of the Nth slit. However, when N low-rigidity portions are to be formed by N slits, a highly accurate lead frame having the effect of the present application can be obtained by satisfying condition 3 at each low-rigidity portion.

The difference between the effects of the slits described in this embodiment and in Japanese Unexamined Patent Publication No. 2-273962 will be described below. The bending direction of the low-rigidity portion in the effect of absorbing distortion by slits shown in FIGS. 1 to 4 of Japanese Unexamined Patent Publication No. 2-273962 is different from the bending direction of the low-rigidity portion in the effect of absorbing distortion in this embodiment by 90°. In the effect of absorbing distortion by slits shown in FIGS. 1 to 4 of Japanese Unexamined Patent Publication No. 2-273962, as is apparent from FIGS. 2 and 4 of Japanese Unexamined Patent Publication No. 2-273962, the rigidity of the end portions of each slit is increased in such a manner that the lead frame is displaced in a Z-axis direction perpendicular to the plane of the lead frame. On a member having a rectangular section, a material cross dimension of W, a material depth dimension of T, and a longitudinal dimension of L, a compression load acts in the longitudinal direction of the member. In this case, if the constraint of both the ends of the member is strong, the member is curved in such a manner that an axis having a small sectional secondary moment is the center of curvature. The dimensions of a low-rigidity portion formed by the slits shown in FIGS. 1 to 4 of Japanese Unexamined Patent Publication No. 2-273962 are expressed as W>T, and the bending direction of the low-rigidity portion is expressed as a direction of thickness, i.e., the Z-axis direction.

The sectional secondary moment 1 of a member having a rectangular section, a width of W, a depth dimension of T, and a longitudinal dimension of L includes a sectional secondary moment IX related to an X axis, a sectional secondary moment IZ related to a Z axis, and a sectional secondary moment IY related to a Y axis, and the values of these sectional secondary moments are given by the following equations:

$$IX = W \times T^3 / 12$$

$$IZ = T \times W^3 / 12$$

$$IY = L \times T^3 / 12$$

When these equations are examined, apparently, the value of IX is the smallest, the value of IZ is the second, and the value of IY is the largest. The sectional secondary moment IX is determined by the width W and depth dimension T of the member, and the banding direction of the member is the direction of the depth dimension T, i.e., the Z-axis direction. In contrast to this, in a low-rigidity portion constituted by slits according to the present application, the width W is arranged in a direction in which thermal deformation occurs, i.e., the Y-axis direction, and the longitudinal dimension L of the material is perpendicular to form an X shape in the Y-axis direction in which thermal deformation occurs. Deformation occurs when a load concentrically acts on the central portion of a both-end-fixed beam of the member having the sectional secondary moment IZ.

The sectional secondary moment IZ is larger than the sectional secondary moment IX because the dimensions of the low-rigidity portion formed by the slits shown in FIGS. 1 to 4 of Japanese Unexamined Patent Publication No.

2-273962 are expressed as W>T. When the low-rigidity portion is arranged to satisfy W≦T as in the present application, the sectional secondary moment IZ can be equal or smaller than the sectional secondary moment IX, and the direction of displacement can be limited to the X-Y plane. Assume that deformation occurs in the Z-axis direction as in Japanese Unexamined Patent Publication No. 2-273962. In this case, when the lead frame is moved and conveyed to bond a new IC chip upon completion of bonding of one IC chip, the lead frame comes into contact with or collides with a bonding apparatus, so that the lead frame is deformed or broken. For this reason, in the lead frame according to the present application, slits are arranged in such a manner that deformation caused by heat generated in the assembling step is changed into deformation in the X-Y plane in the plane of the lead frame. As has been described above, a horizontal member and a vertical member are described as a lead frame edge and a section bar, respectively, to explain the difference between slits for absorbing thermal deformation described in the present application and conventional slits for absorbing thermal deformation described in Japanese Unexamined Patent Publication No. 2-273962. However, the invention is not limited to the above description, it is effective if slits according to the present invention are formed in a portion where members constituting a lead frame are perpendicular to each other.

Figure 32:
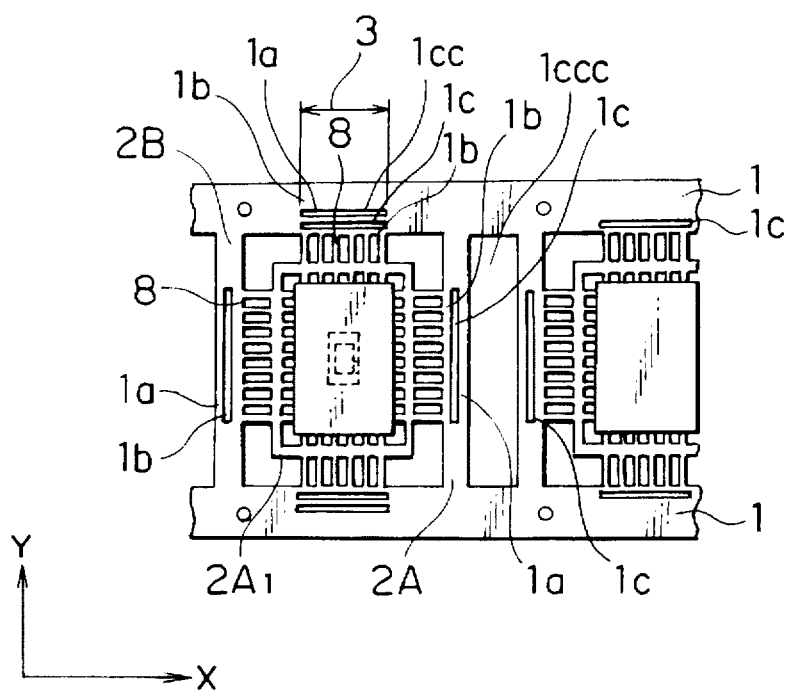
FIG. 32 is a plan view showing a conventional lead frame.
Figure 33:
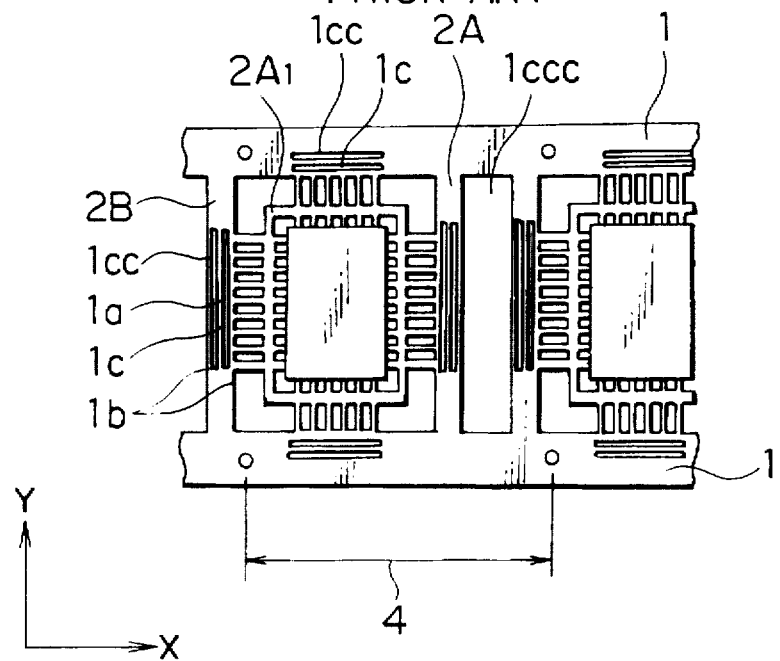
FIG. 33 is a plan view showing another conventional lead frame.
Figure 34:
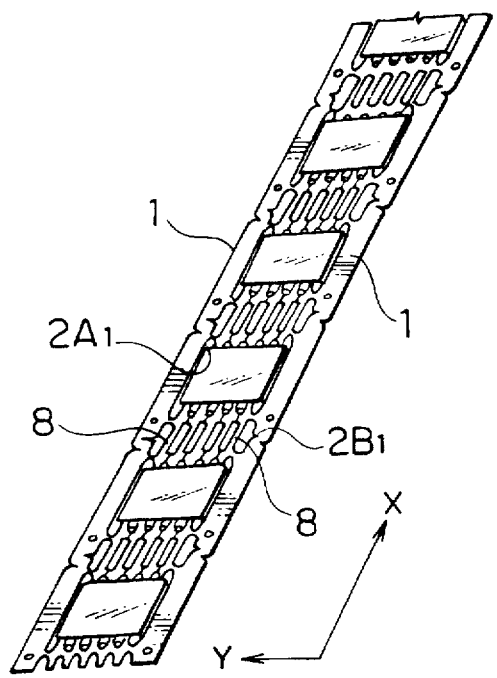
FIG. 34 is a view showing still another conventional lead frame.
Figure 35:
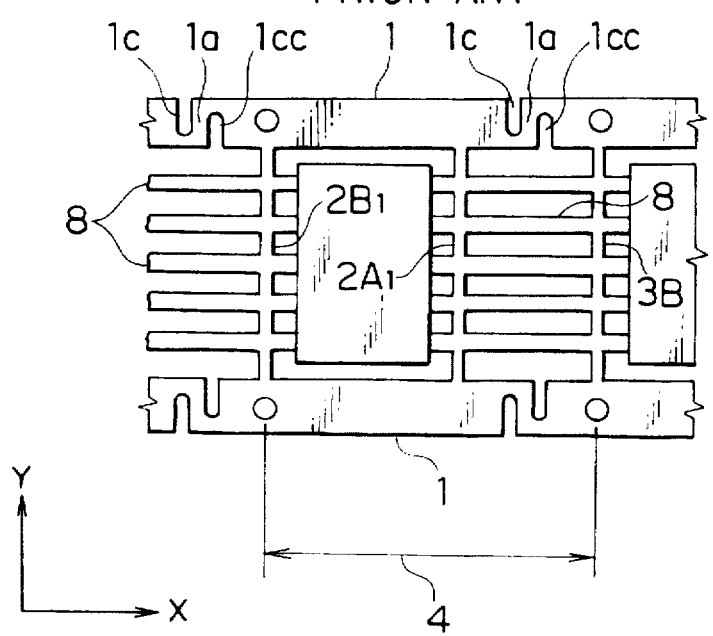
FIG. 35 is a plan view showing still another conventional lead frame.
Figure 36:
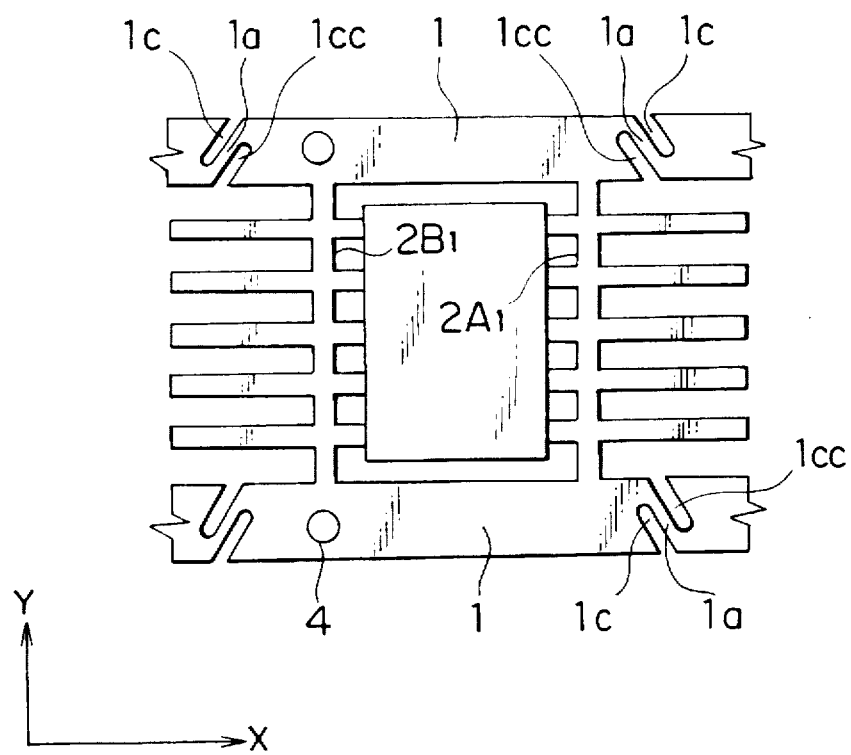
FIG. 36 is a view showing still another conventional lead frame.
Figure 37:
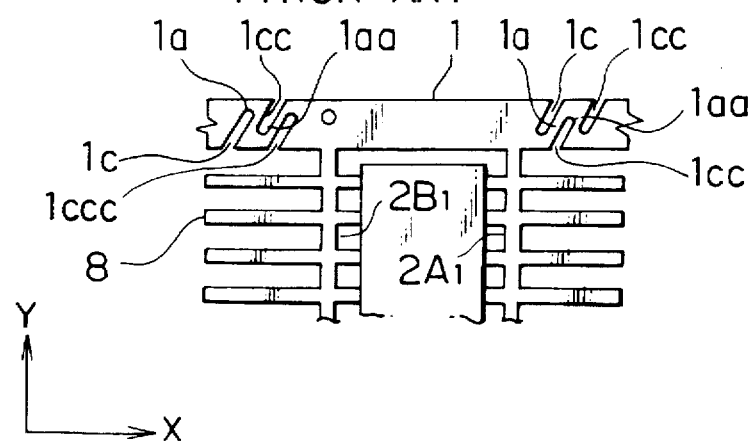
FIG. 37 is a plan view showing still another conventional lead frame.
Figure 38:
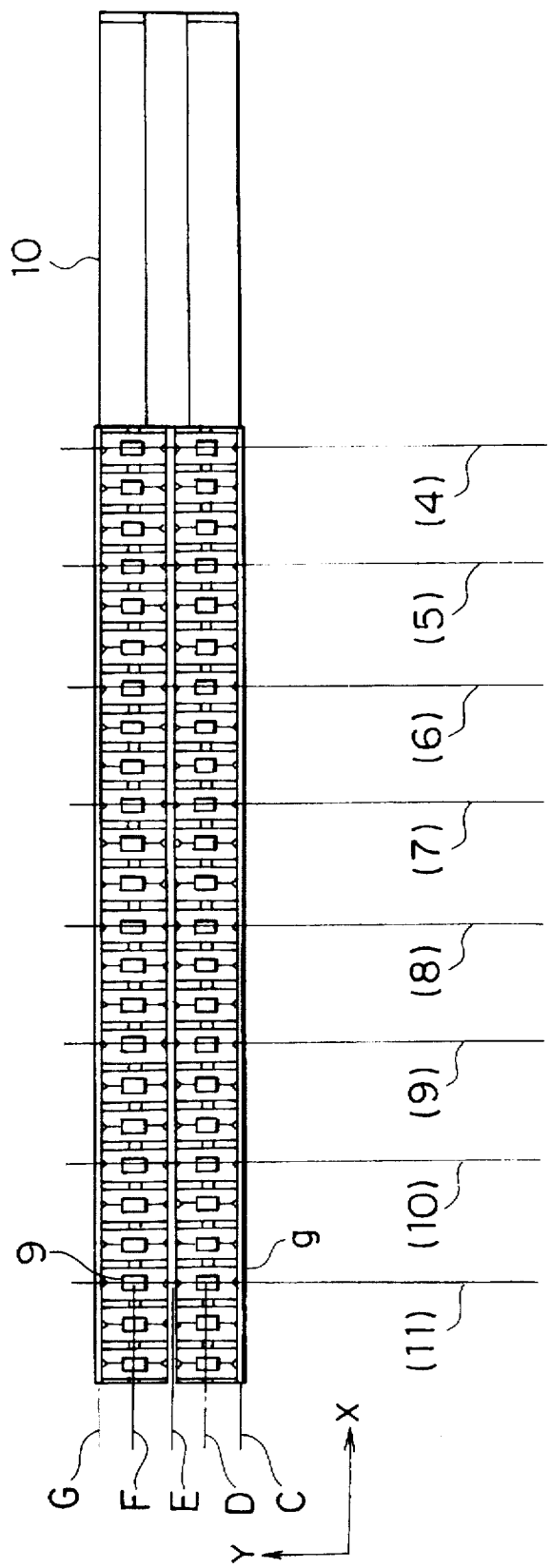
FIG. 38 is a plan view showing measurement points used when temperatures are measured to determine a temperature distribution in a state when a conventional lead frame is conveyed onto a heat block.
Figure 39:
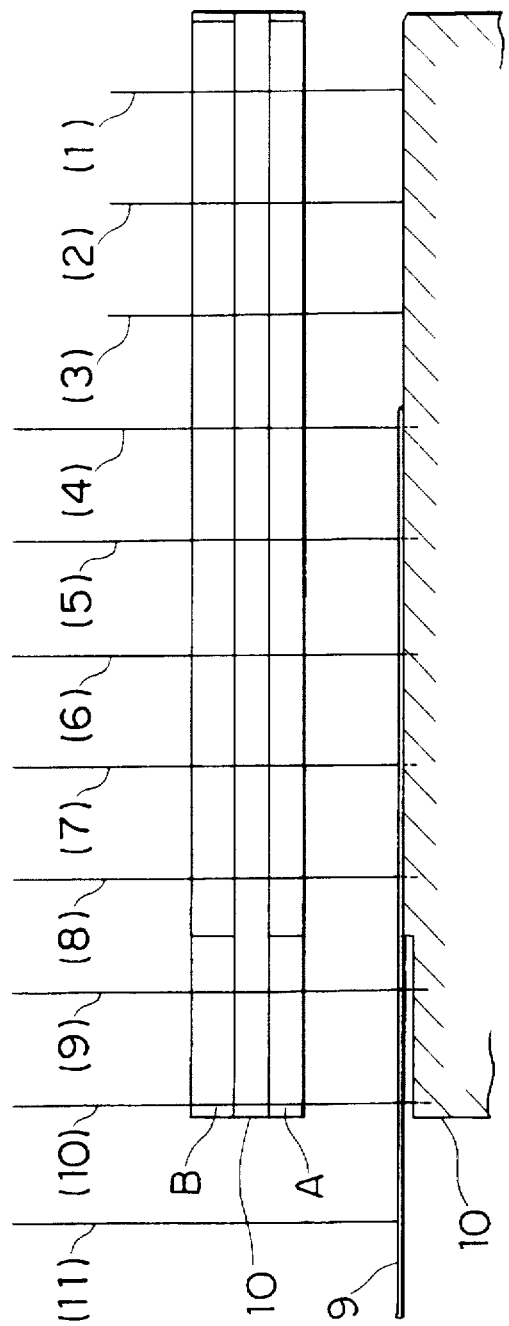
FIG. 39 is a plan view showing measurement points used when temperatures are measured to determine a temperature distribution in a state when a conventional lead frame is conveyed onto a heat block.
Figure 40:
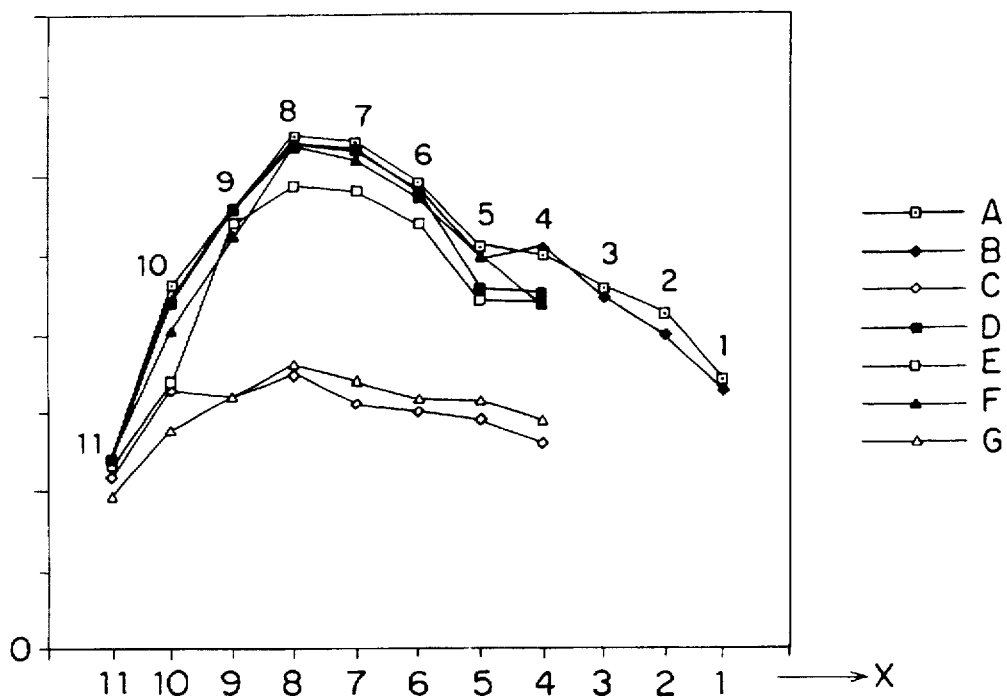
FIG. 40 is a graph showing a temperature difference obtained when crossing points A to G and crossing points 1 to 11 shown in FIGS. 38 and 39.
Figure 41:
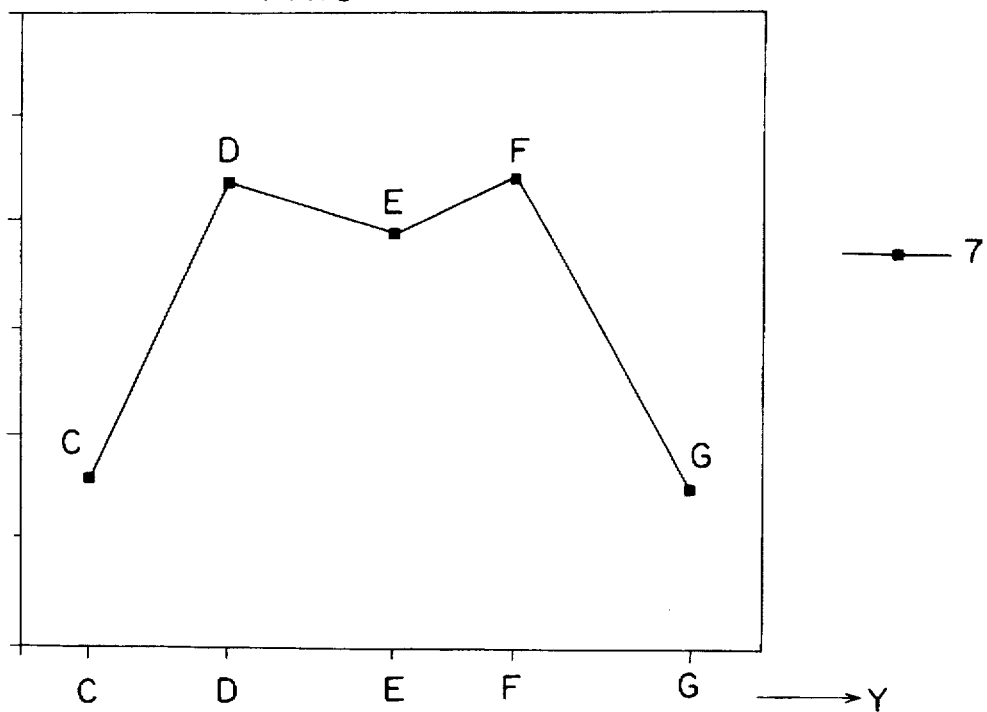
FIG. 41 is a graph showing a cross-direction temperature distribution at the positions A to G shown in FIGS. 38 and 39.
Figure 42:
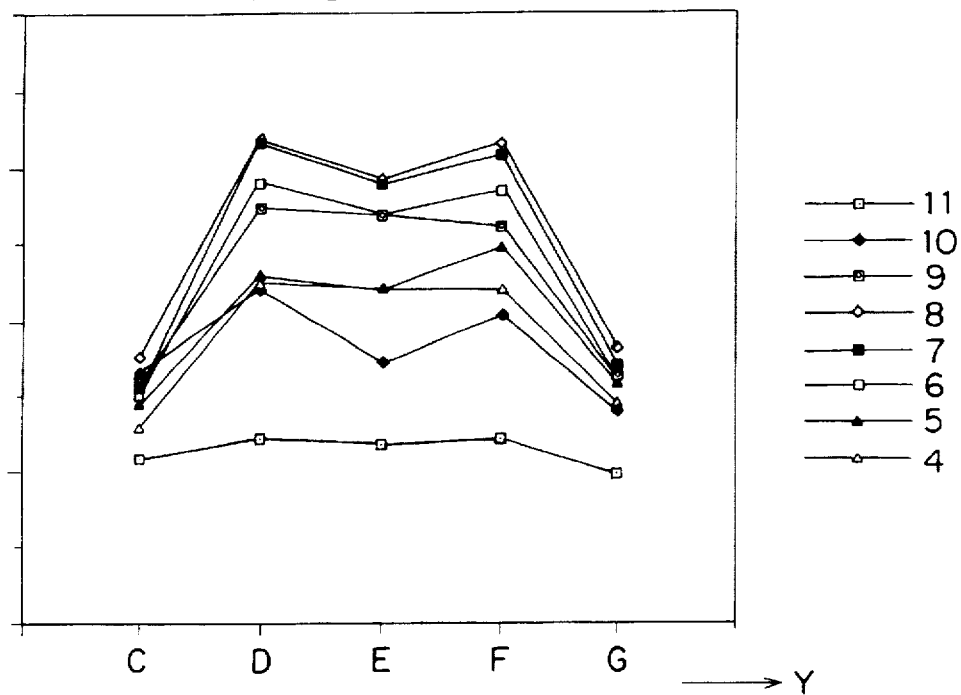
FIG. 42 is a graph showing a temperature distribution obtained when temperatures at the crossing points C to G and the crossing points 4 to 11 on the upper surface of the lead frame shown in FIG. 38 are measured.
Figure 43:
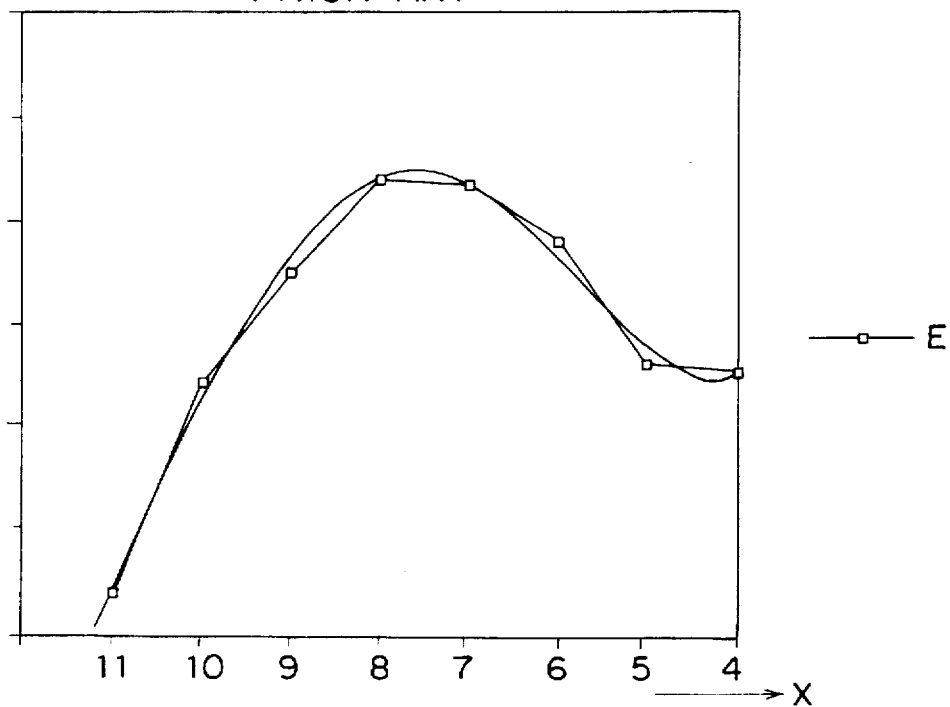
FIG. 43 is a graph showing a temperature distribution at the points 4 to 11 on a line E on the upper surface of the lead frame shown in FIG. 38.
Figure 44:
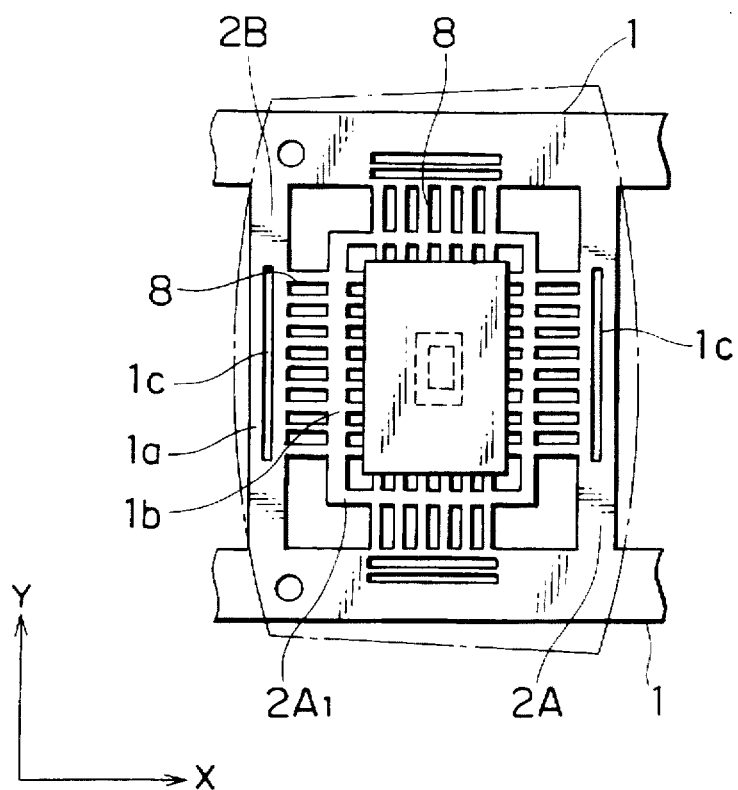
FIG. 44 is a plan view for explaining thermal deformation occurring in a conventional lead frame.

Referring to FIG. 32, the length of the first slit is equal to that of the second slit, a low-rigidity portion 1a is arranged outside the first slit by the first slit. At this time, although it is not described in Japanese Unexamined Patent Publication No. 2-273962, a small-width portion 1b of two portions 1b in lead frame edges 1 perpendicular connected to external leads constitutes a low-rigidity portion. In a portion having a width equal to the width of the portion 1b and a length of 3, as shown in FIG. 3, both the end portions of the first slit are support ends. As described in Japanese Unexamined Patent Publication No. 2-273962, since the length of the first slit is equal to that of the second slit in a portion having a width equal to the width of the low-rigidity portion 1a and a length of 3, both the end portions of the first slit coincide with both the end portions of the second slit, and both the end portions of the second slit are also used as support ends. For this reason, the support ends of the first slit coincide with the support ends of the second slit. Therefore, it is understood that the low-rigidity portion constituted by the second slit does not contribute-to absorption of an amount of deformation caused by heat generated by an external lead 8.

Figure 27:
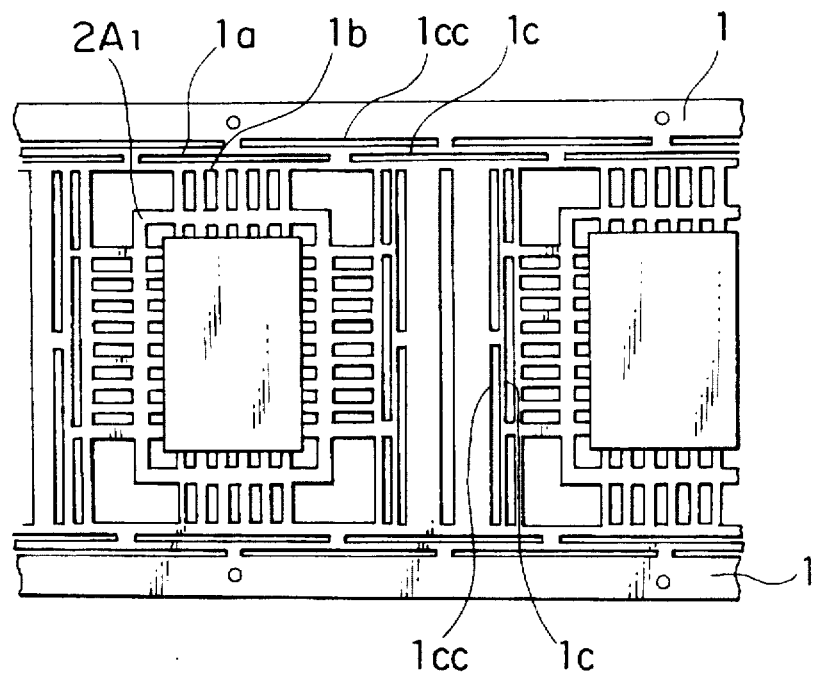
FIG. 27 is a plan view showing still another embodiment of the present invention.

FIG. 27 shows an example wherein slits according to this embodiment is applied to Japanese Unexamined Patent Publication No. 2-273962. Referring to FIG. 27, since each first slit and each second slit are shifted from each other, the support positions of both the end portions of the first slit are shifted from the support positions of both the end portions of the second slit by a length which is almost half the length of each slit. Since the slits are arranged as described above, a first low-rigidity portion formed by the first slit, i.e., a member having a cross dimension of 1b and a length of 3a is displaced, the start-point portions of both the end portions of the member are displaced by an amount of displacement of a second low-rigidity portion, i.e., a member having a cross dimension of 1a and a length of 3b. When the first slit and the second slit are shifted from each other, as described above, an effect of absorbing displacement which is completely different from the effect obtained when the first and second slits are not shifted from each other can be obtained.

In FIG. 32 showing the embodiment in Japanese Unexamined Patent Publication No. 2-273962, since neither the first slit nor the second slit are formed in portions where the lead frame edge 1 is perpendicular to and connected to the section bars 2A and 2B, there is no portion for absorbing expansion of the section bars 2A and 2B caused by a temperature distribution in the longitudinal direction of the lead frame. For this reason, deformation occurring when the lead frame is deformed to have a trapezoidal shape cannot be absorbed, and deformation occurring when the lead frame is deformed by a temperature distribution in the cross direction of the lead frame to have a drum-like shape also cannot be absorbed.

Embodiment 2

FIG. 11 shows Embodiment 2 of the present invention. FIG. 11 shows the following example. That is, in a lead frame in which two parallel lead frame edges 1, die bars $2A_1$ and $2A_4$, section bars $2A_2$ and $2A_3$, and a tab suspension lead (tie pad suspension lead) 7 which is continuously connected to leads 7a and 7b are arranged, thermal deformation absorbing slits 1c and 1cc according to the present invention are formed in portions where the lead frame edge 1 is perpendicular to and connected to the section bars, and the slits 1c and 1cc are formed in a portion where the tab suspension lead (die pad suspension lead) 7 is perpendicular to the lead frame edge through the leads 7a and 7b.

In particular, a tab 9 is heated to the highest temperature by a heat block and the tab suspension lead 7 is connected to the tab 9. For this reason, thermal deformation in a trapezoidal deformation mode occurs because of an axial direction temperature difference, and thermal deformation in a drum-shaped deformation mode occurs at a die bonding point. Therefore, a double slit as shown in FIG. 11 is effective formed to absorb thermal deformation. Since the ends, near the tab, of the inner leads of the lead frame are not influenced by deformation of the lead frame according to the present invention because the ends are free ends, the ends are omitted in FIG. 11.

In thermal deformation of a lead frame, its closed-rectangular frame member poses a problem, and perpendicular members indicate portions constituting the closed-rectangular frame member. Therefore, a portion where a horizontal member is perpendicular to a vertical member is relatively expressed in the present invention. The frame edge may be used as either one of the horizontal member and the vertical member as a matter of course. However, this is not the essence of the present invention, but only the description of the present invention. In an embodiment according to the present invention, inner leads 6 are partially omitted in FIG. 11. In addition, although this embodiment is described by using both-end-support beams and both-end-fixed beams, an arrangement equivalent to the arrangement for solving the problem of the same beam as the cantilevered beam can be obtained, a description of the arrangement is omitted.

Since the slits are formed in the portions where members are perpendicular to each other, it is cumbersome to describe all the portions. For this reason, typical embodiments will be described below. However, it is the principal consideration of the present invention to form thermal deformation absorbing slits shown in the present invention in portions where members are perpendicular to each other providing a strong constraint in a frame member which has a rectangular shape and is closed. In this arrangement, a direction of thermal deformation is set in such a manner the thermal deformation occurs in the plane of the lead frame, and the slits are formed in a portion where a right-angle member corresponding to a loading point is connected to a horizontal member. Each slit is expressed in FIG. 6 by using the following equation:

$$\delta = \{(Pl_1{}^3 l_2{}^3)/(6EIl)\} \cdot (2x/l + x/l_2 - x^3(l_1{}^2 l_2))$$

$$0 \leq x \leq l_1$$

When $l > l_2$ is established, the maximum value of bending is expressed by the following equation:

$$\delta_{max} = \{Pl_2(l^2 - l_2{}^2)^{3/2}\}/(9\sqrt{3} \cdot E \cdot l \cdot I)$$

Therefore, even if the loading point is located at a position other than the almost central position, the same effect as that of the present invention can be obtained. In addition, when small vertical slits are formed in the portions 1a and 1e in FIG. 9, a second low-rigidity portion having a length which is half the length 3a has the same effect as that of a cantilevered beam.

Embodiment 3

Figure 12:
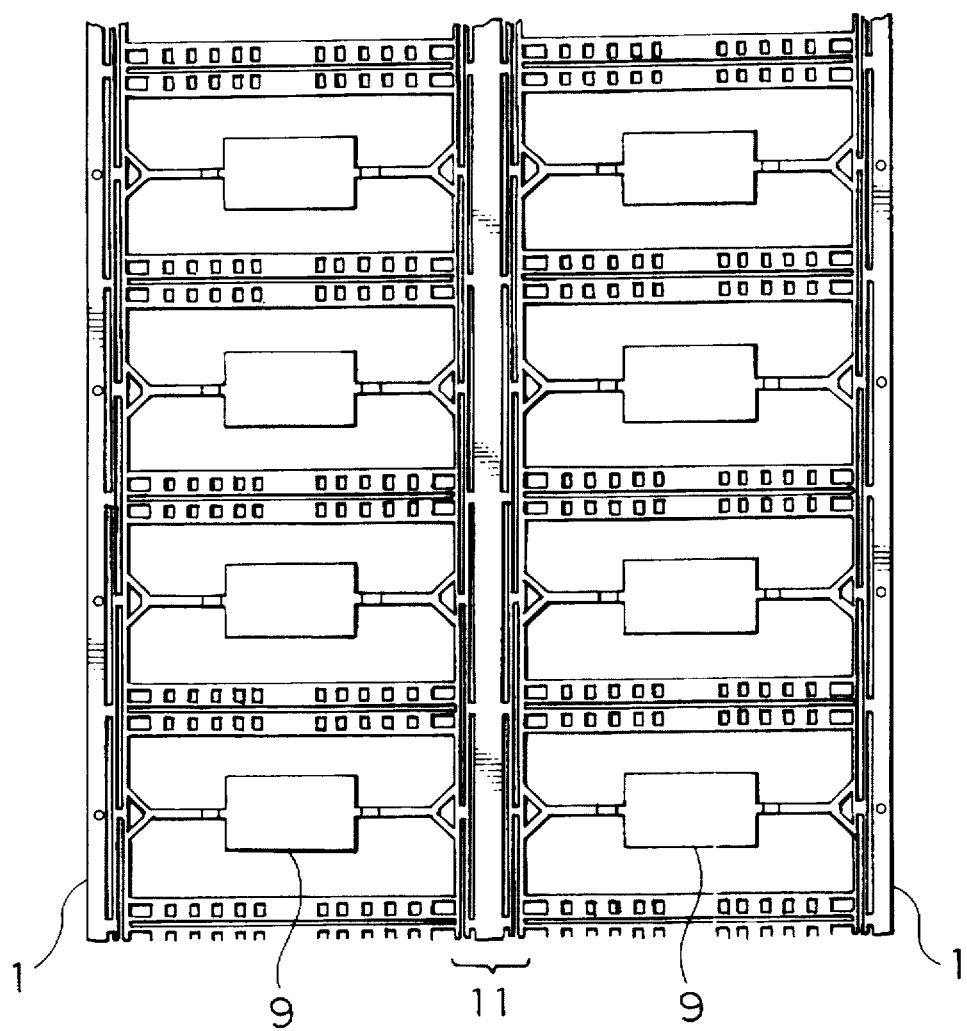
FIG. 12 is a plan view showing a lead frame according to Embodiment 3 of the present invention.

FIG. 12 shows an example wherein double slits according to the present invention are formed in portions of a matrix frame obtained by arranging die pads along parallel lines. In this example, intermediate edge 11 is arranged between two parallel frame edges 1, double slits according to the present invention are formed in the intermediate edge 11. However, depending on the interval between the two parallel lead frame edges 1, the double slits in the intermediate edge 11 can be omitted.

Embodiment 4

Figure 13:
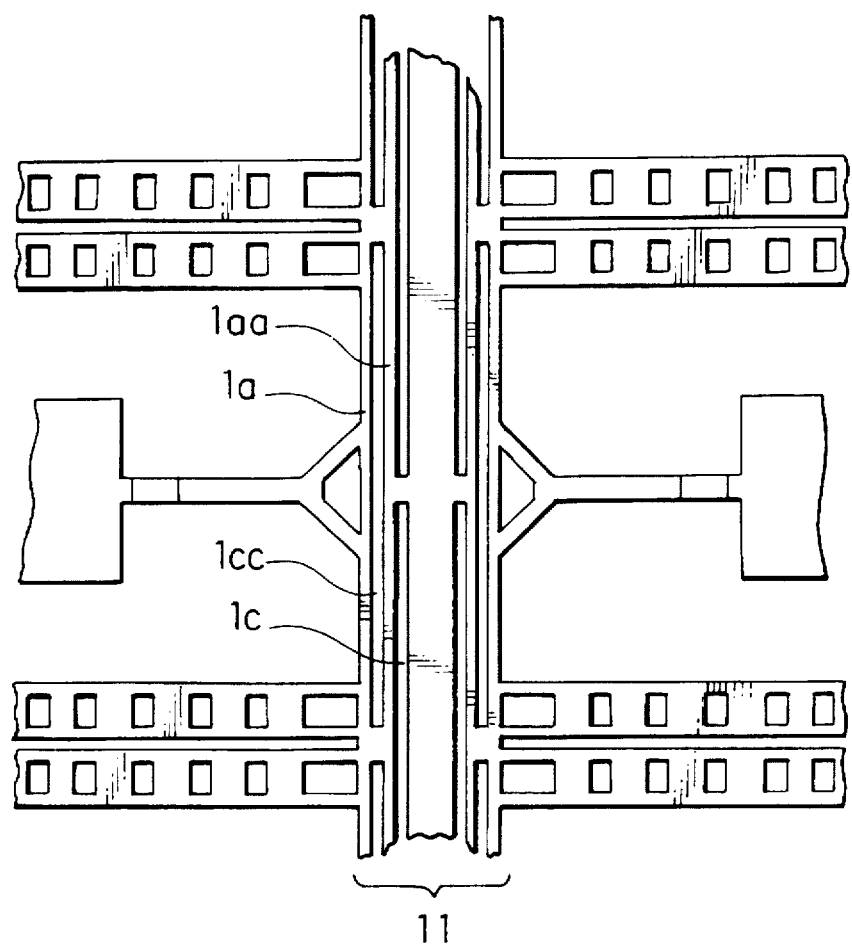
FIG. 13 is a plan view showing a lead frame according to Embodiment 4 of the present invention.
Figure 14:
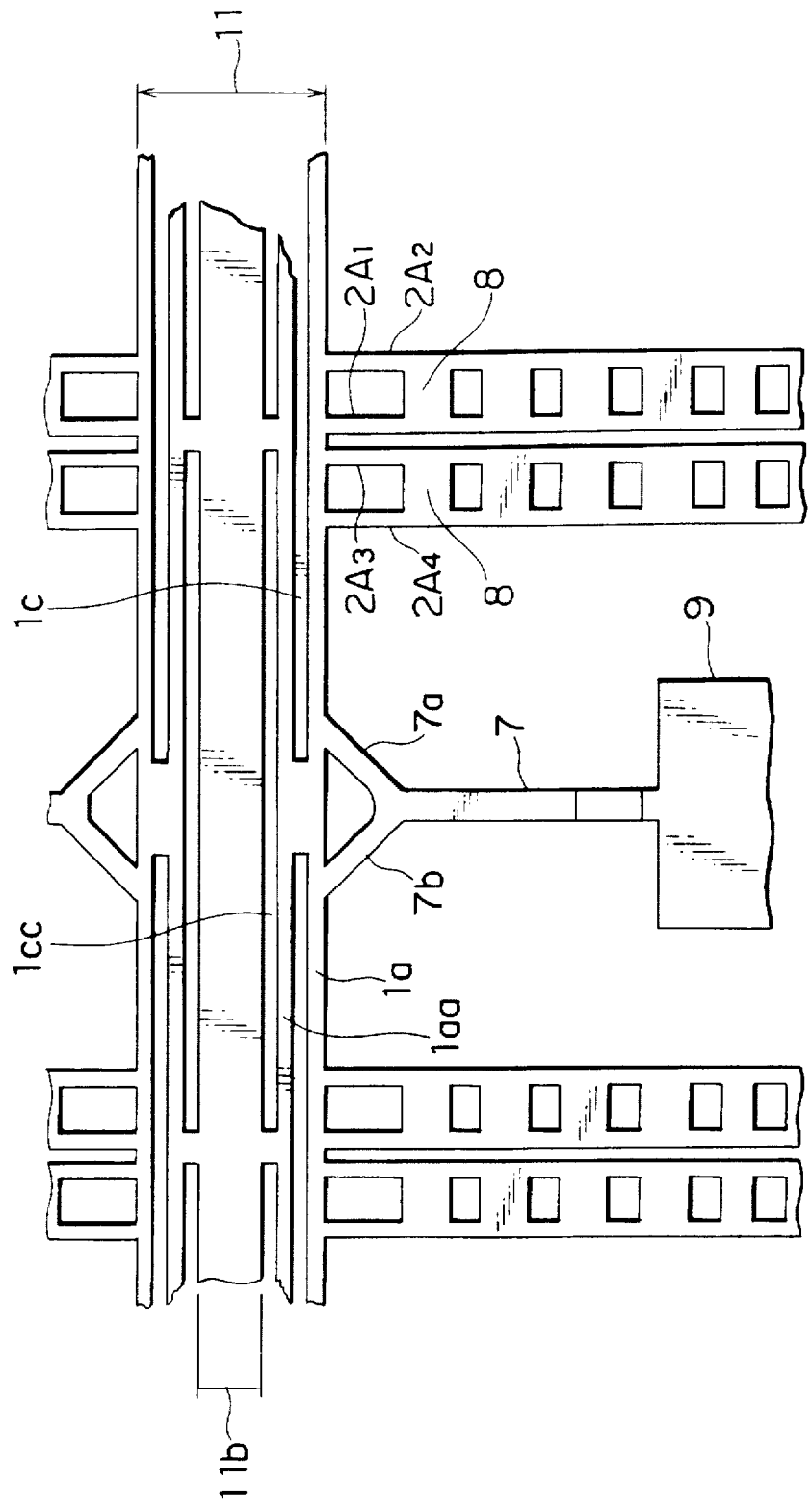
FIG. 14 is a plan view showing a modification of Embodiment 4.
Figure 15:
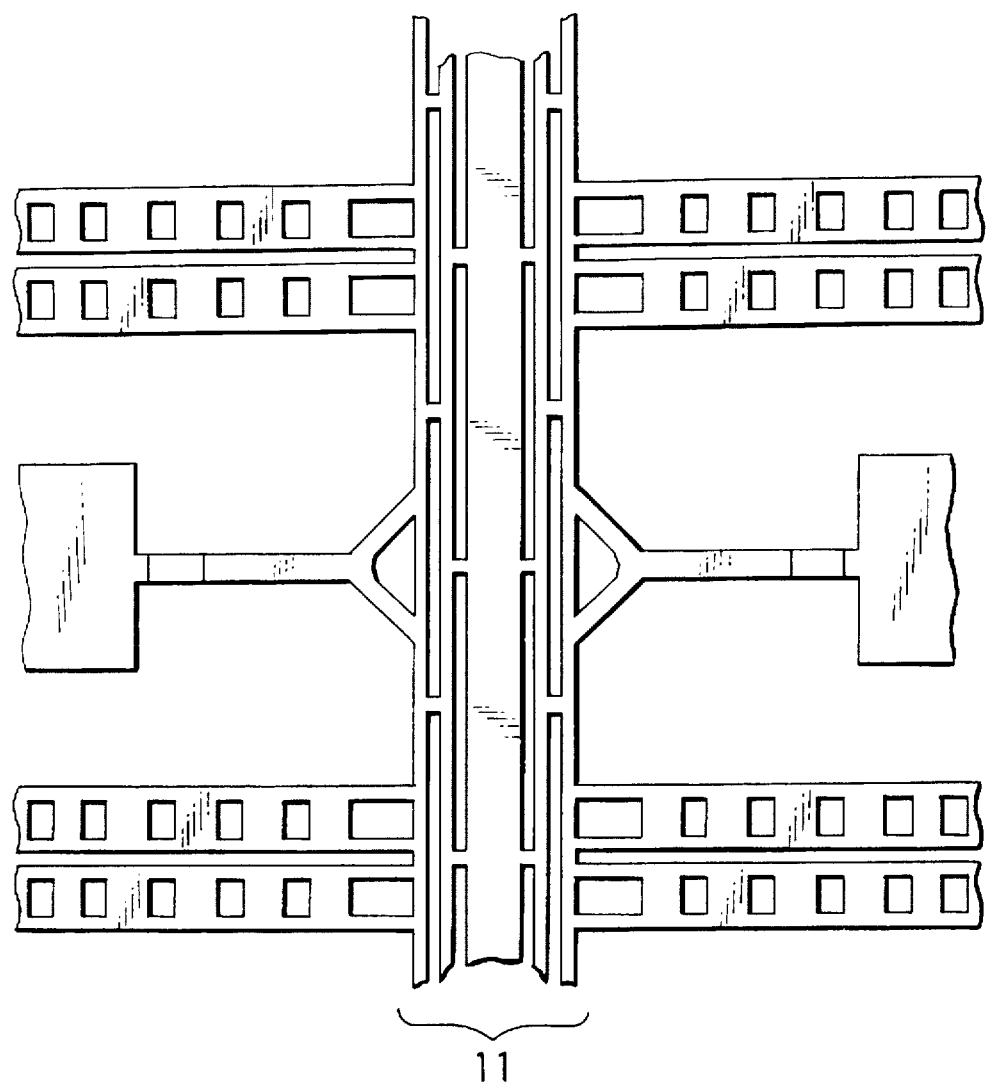
FIG. 15 is a plan view showing a modification of Embodiment 4.

FIG. 13 shows an example wherein double slits are formed in the intermediate edge 11. In FIG. 14, the first and second slits 1c and 1cc of the double slits are formed an order which is obtained by reversing the order in FIG. 13. FIG. 15 shows an example wherein a large number of slits having different lengths are included. The length of each slit can be either increased or decreased.

Embodiment 5

Figure 16:
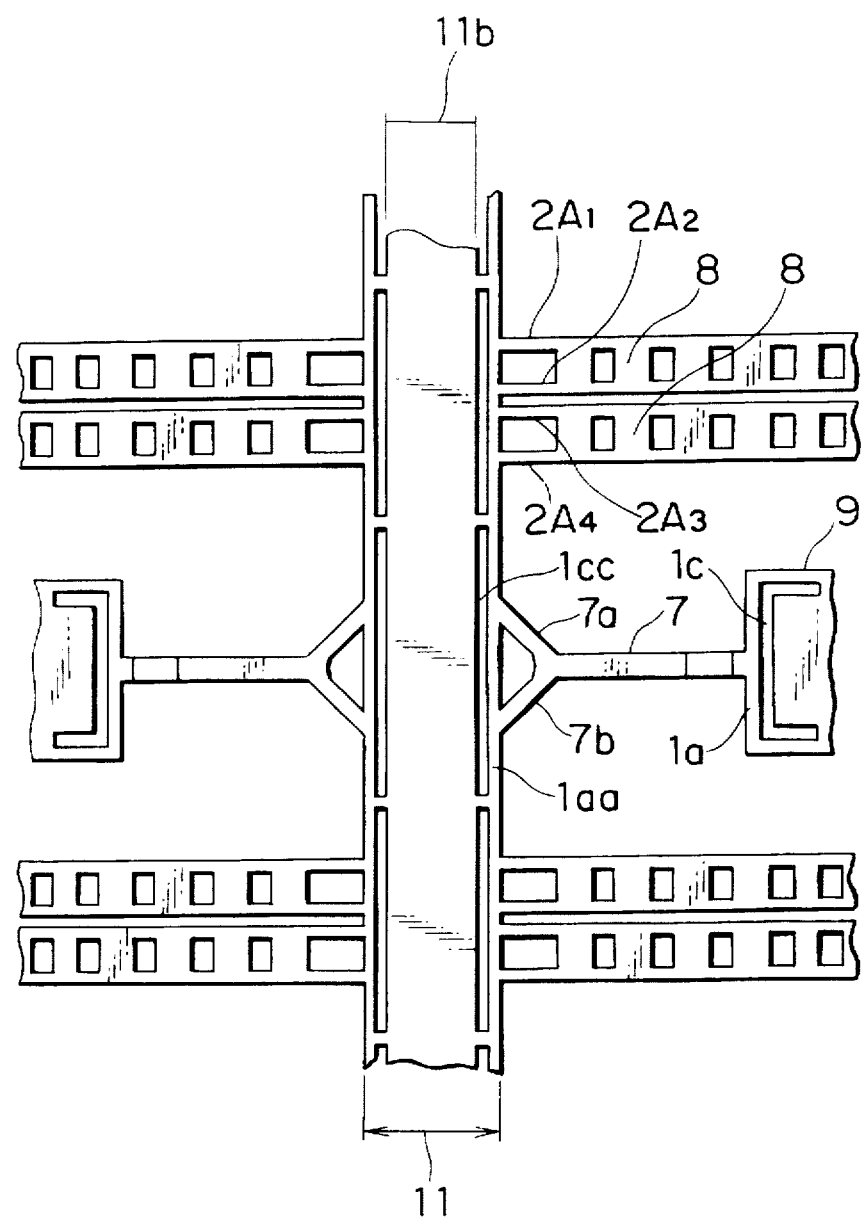
FIG. 16 is a plan view showing another embodiment of the present invention.

FIG. 16 shows a case wherein the first slit of each double slit is formed in a portion where a tab 9 is perpendicular to and connected to a tab suspension lead (die pad suspension lead) 7, and the second slits are formed in an intermediate edge 11.

Figure 17:
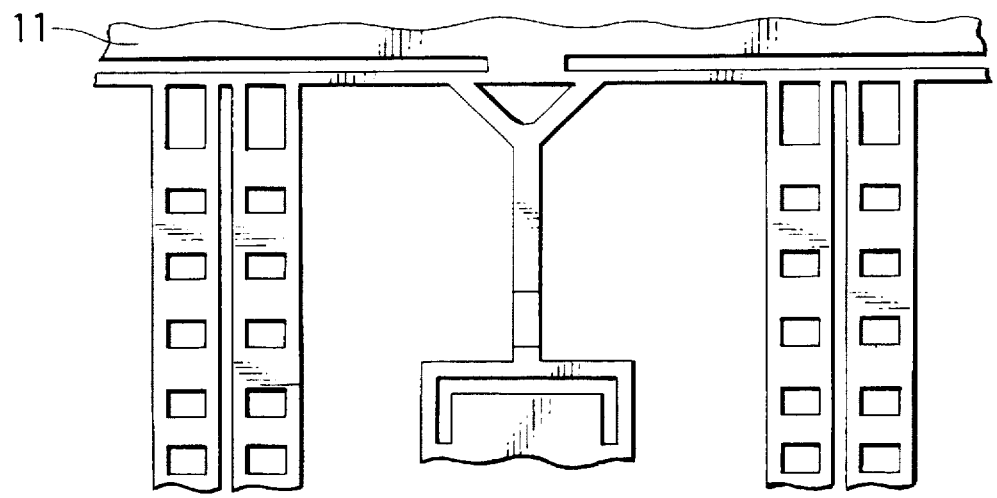
FIG. 17 is a plan view showing still another embodiment of the present invention.
Figure 18:
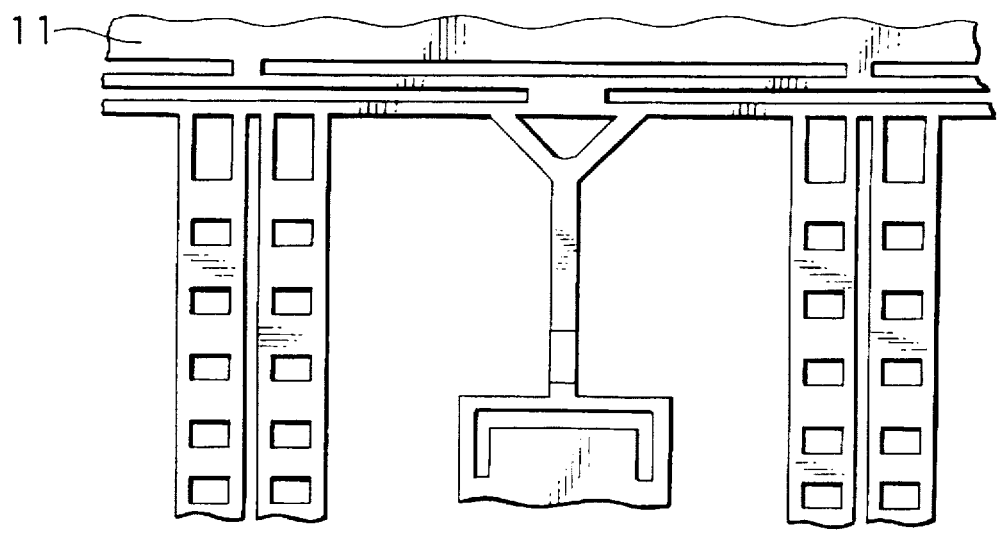
FIG. 18 is a plan view showing still another embodiment of the present invention.
Figure 19:
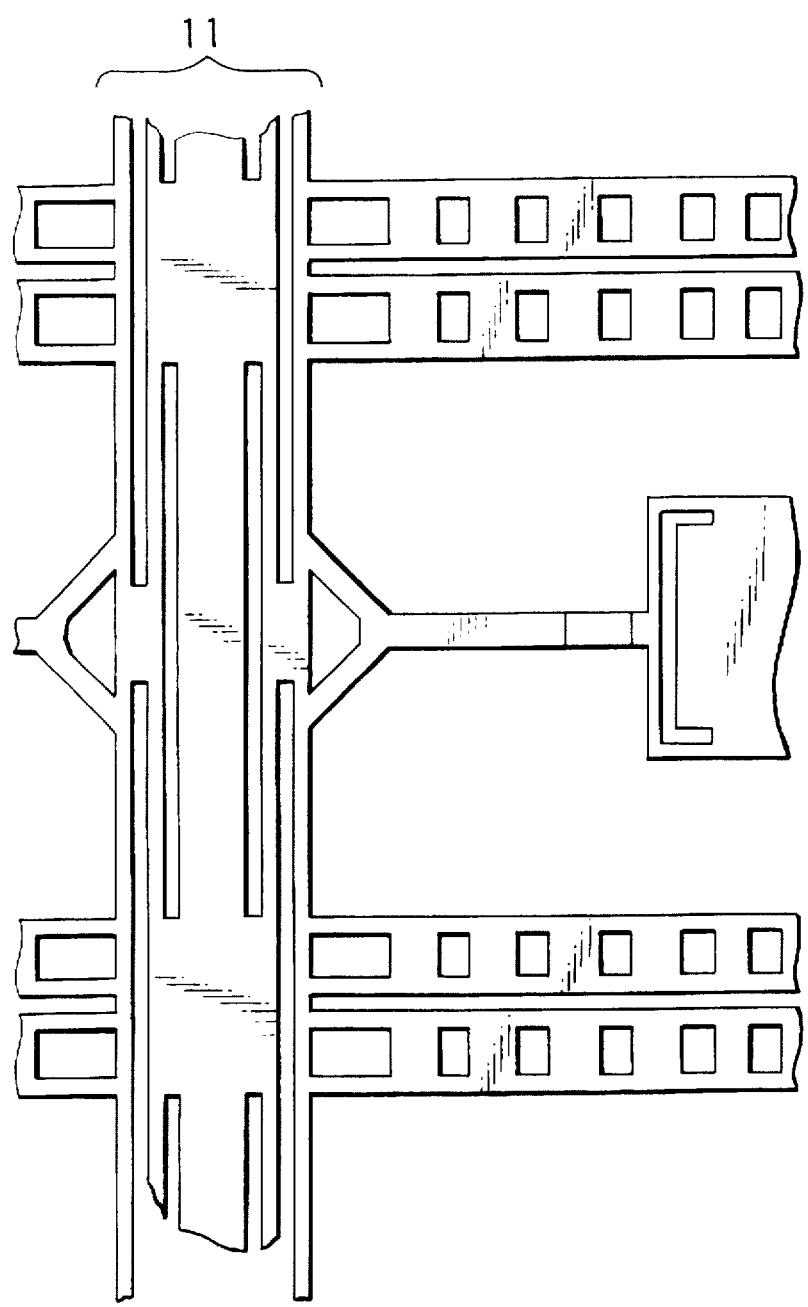
FIG. 19 is a plan view showing still another embodiment of the present invention.
Figure 20:
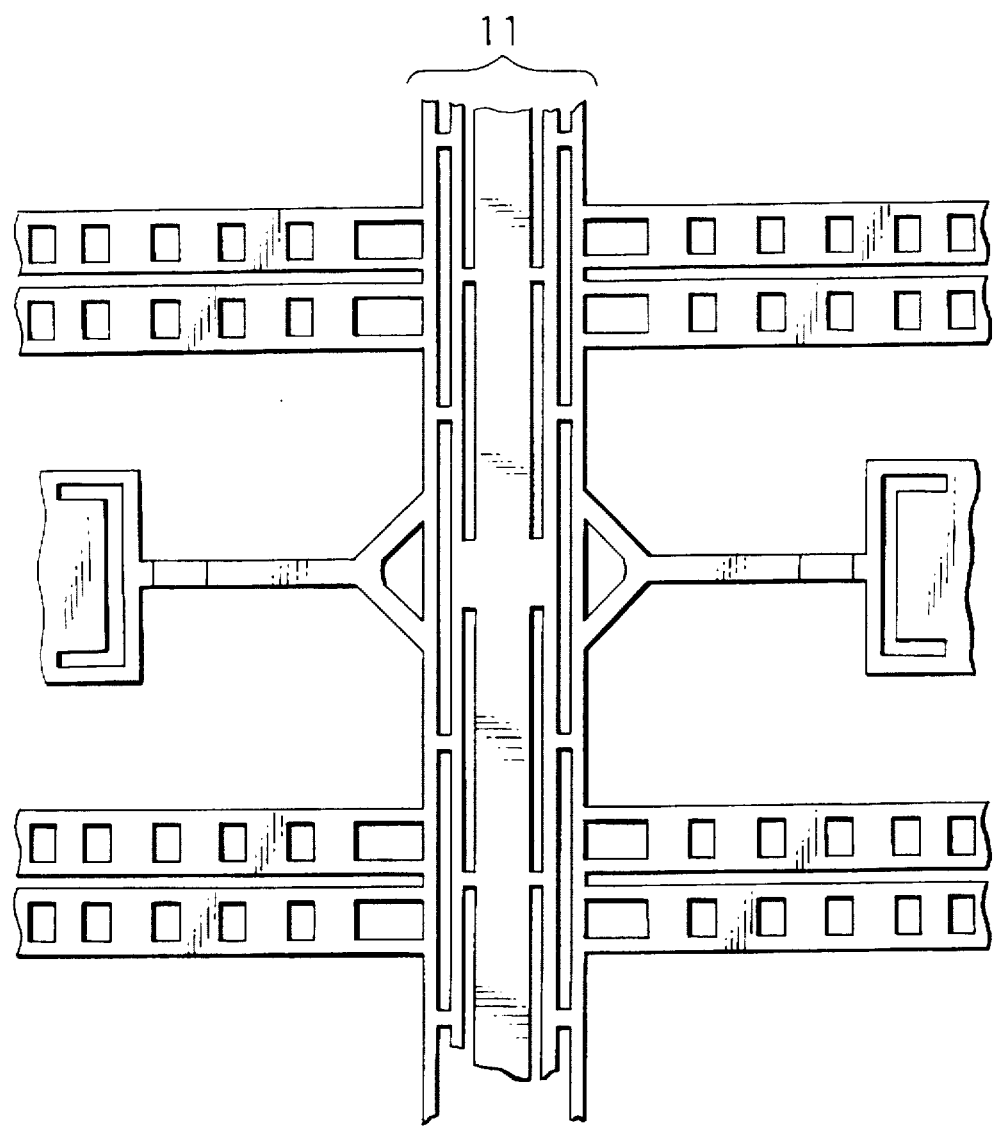
FIG. 20 is a plan view showing still another embodiment of the present invention.
Figure 21:
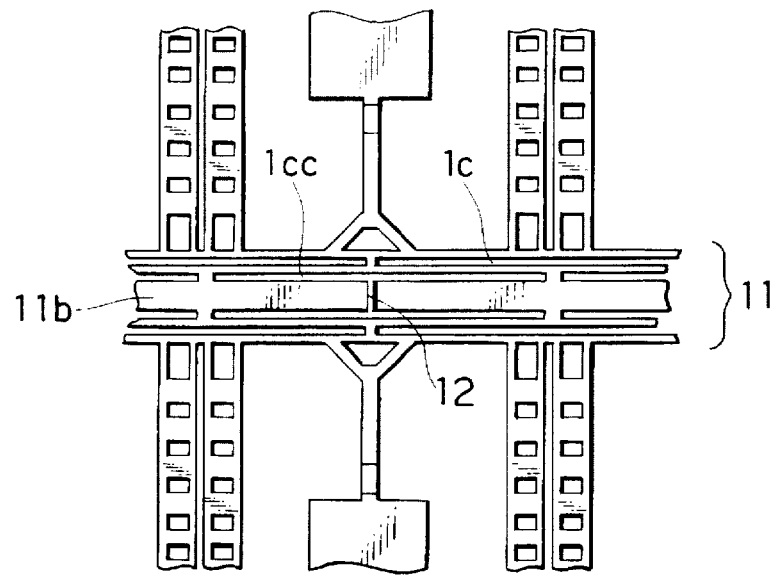
FIG. 21 is a plan view showing still another embodiment of the present invention.
Figure 22:
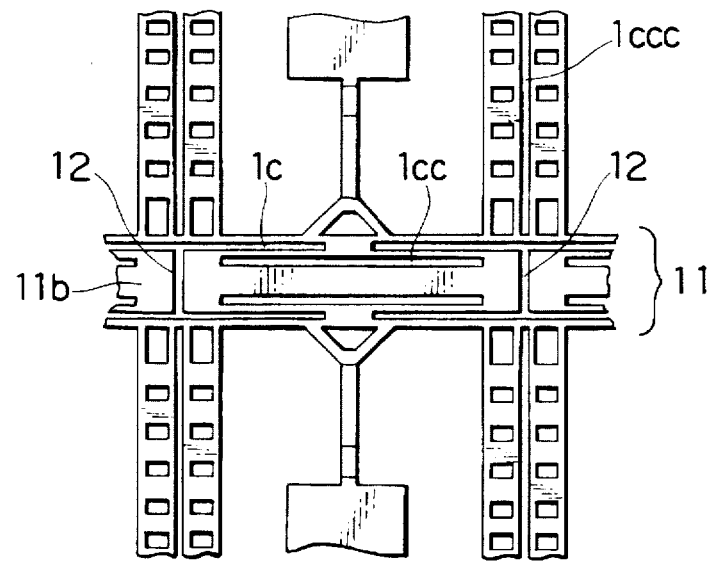
FIG. 22 is a plan view showing still another embodiment of the present invention.

FIG. 17 shows an example wherein each second slit in FIG. 16 is increased in length. FIG. 18 shows an example wherein the first slit is formed in a tab portion, and a double slit constituted by the second and third slits is formed in the intermediate edge 11, so that a triple slit is formed. FIG. 19 shows an example wherein the double slit formed in the intermediate edge 11 is constituted by the first and second slits which have different longitudinal dimensions. FIG. 20 shows an example wherein a double slit formed in the intermediate edge 11 has a small longitudinal dimension. FIG. 21 shows an example wherein a through slit (third slit) 12 for cutting an intermediate edge 11b having high rigidity is formed in a direction perpendicular to the second slits 1cc in such a manner that the through slit 12 passes through between the second slits 1cc of double slits formed in the intermediate edge 11. FIG. 22 shows an example wherein a through slit 12 for cutting the intermediate edge 11b having high rigidity is formed in a direction perpendicular to the first slits 1c in such a manner that the through slit 12 passes through between the first slits 1c of double slits formed in the intermediate edge 11.

Figure 23A:
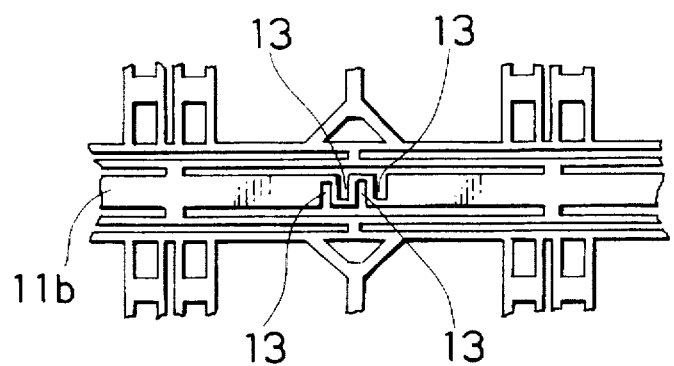
FIGS. 23(a) and 23(b) are plan views showing still another embodiment of the present invention.
Figure 23B:
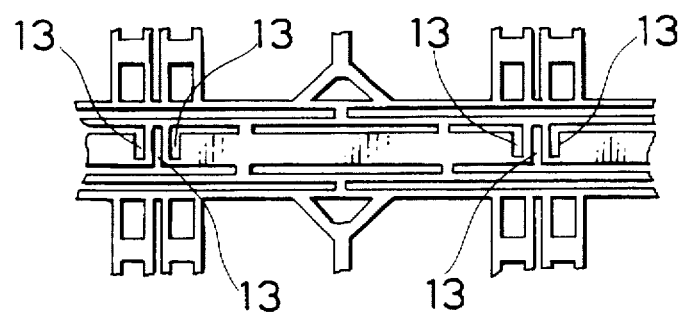
Figure 24A:
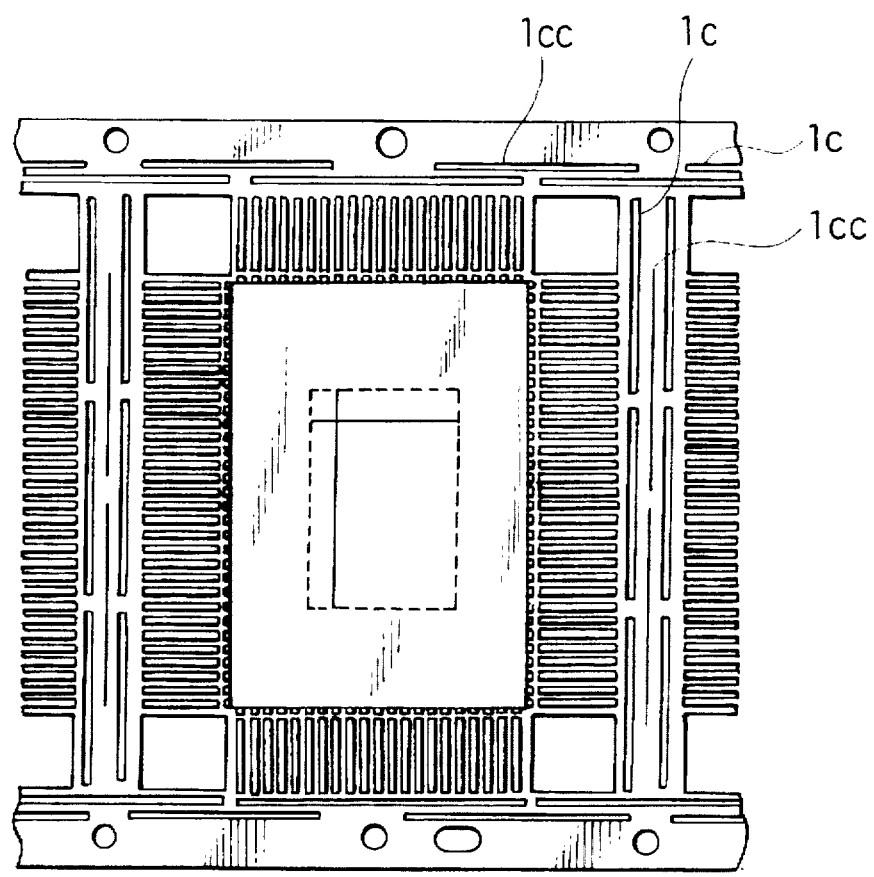
FIGS. 24(a) and 24(b) are plan views showing still another embodiment of the present invention.
Figure 24B:
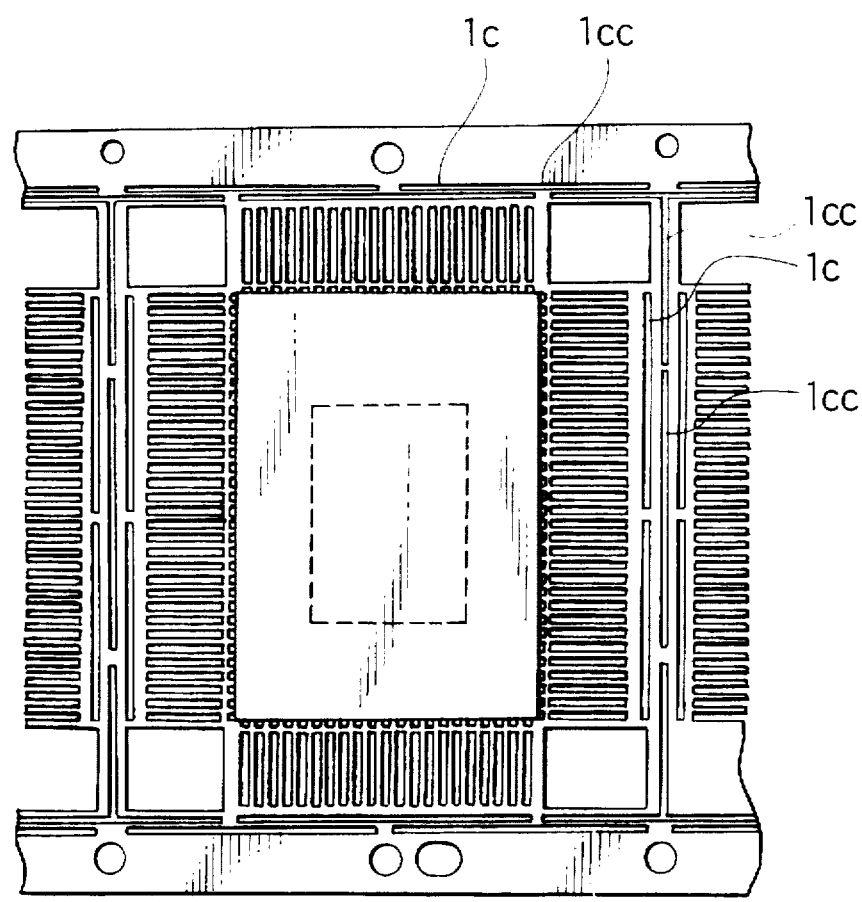
Figure 25:
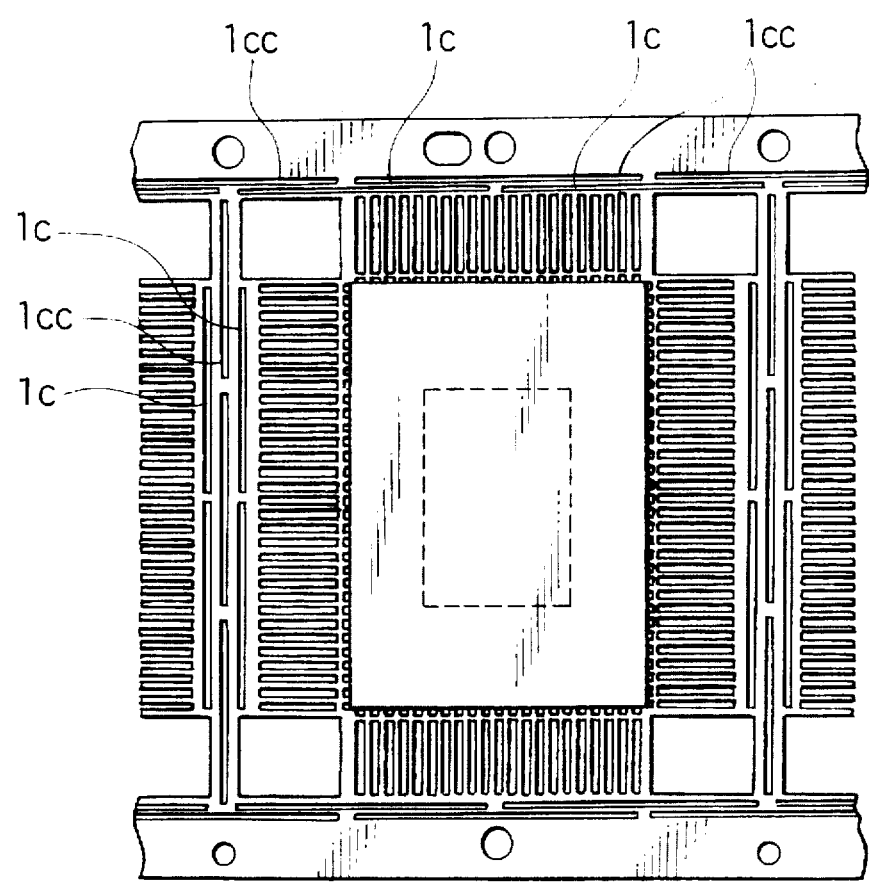
FIG. 25 is a plan view showing still another embodiment of the present invention.
Figure 26:
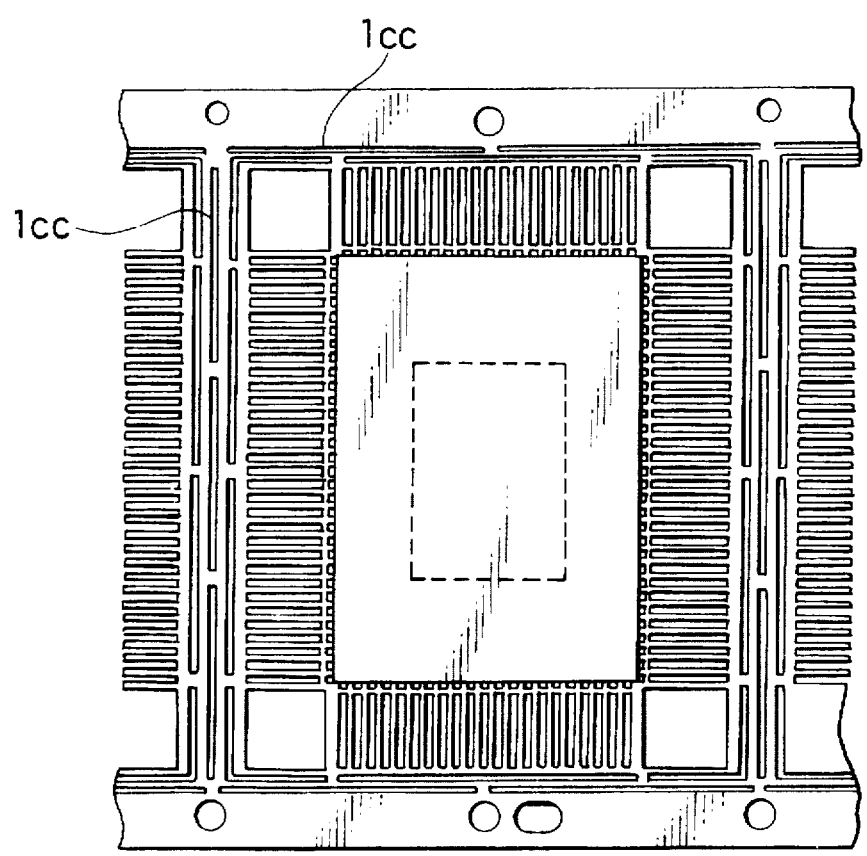
FIG. 26 is a plan view showing still another embodiment of the present invention.

FIG. 23(a) shows the following example. That is, four one-side-through slits 13, none or which pass through the second slits, are of the double slits formed in the intermediate edge 11, which is formed in a direction perpendicular to the second slits, and which has one side which crosses one of the two second slits and the other side which does not cross the second slits, are continuously formed in the intermediate edge 11b, so that a low-rigidity portion is formed in the intermediate edge 11. FIG. 23(b) shows an example wherein three one-side-through slits 13, which are the same as those of the one-side-through slits 13 in FIG. 23(a), are formed. Although FIG. 23(a) shows the case wherein the four one-side-through slits 13 are continuously formed, if the target rigidity is obtained, the number of one-side-through slits 13 may be arbitrarily set.

FIGS. 24(a), 24(b), 25, and 26 show an example wherein slits according to the present invention are applied to a lead frame for a QFP type IC. Referring to FIGS. 24(a), 24(b), 25, and 26, two second slits 1cc which are originally formed in a section bar are gathered together into one slit.

Figure 28:
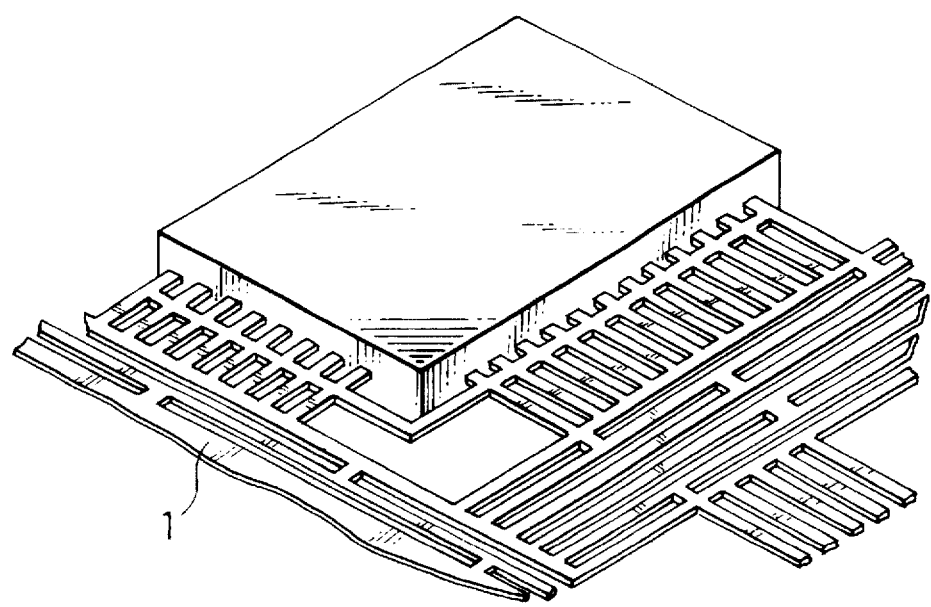
FIG. 28 is a plan view showing still another embodiment of the present invention.
Figure 29:
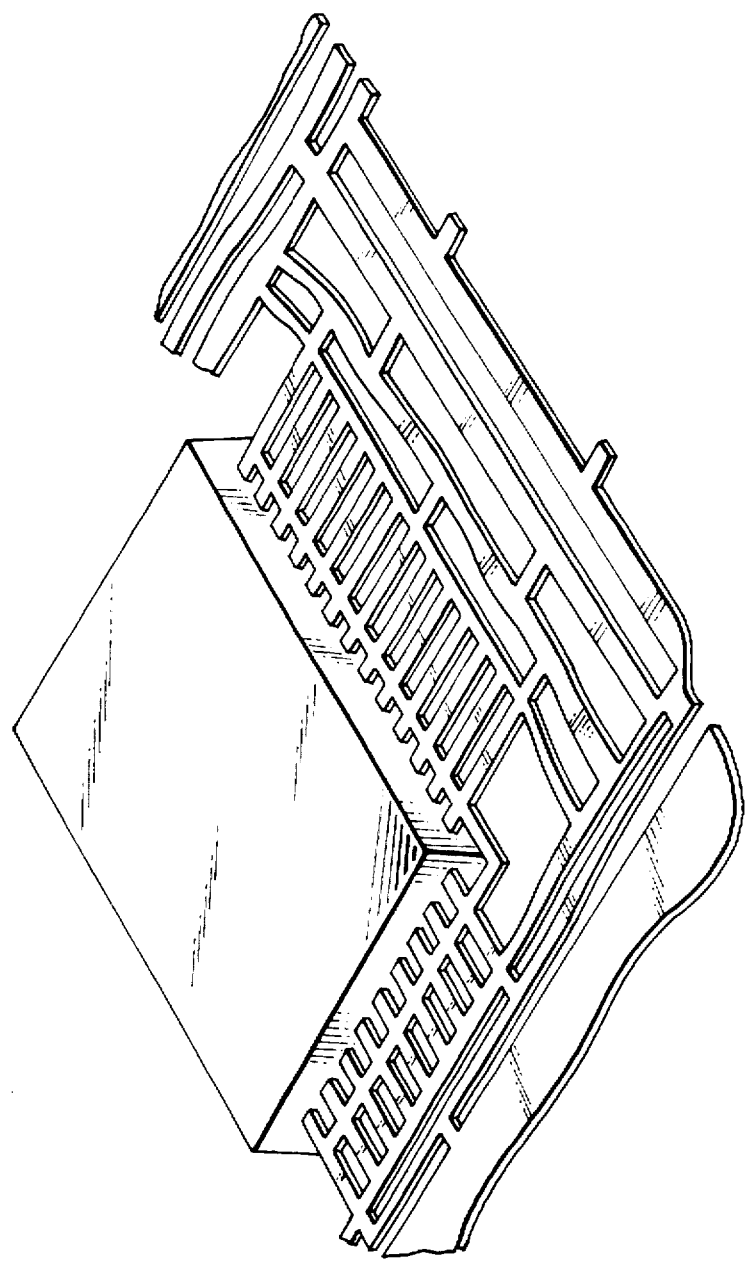
FIG. 29 is a plan view showing still another embodiment of the present invention.
Figure 30:
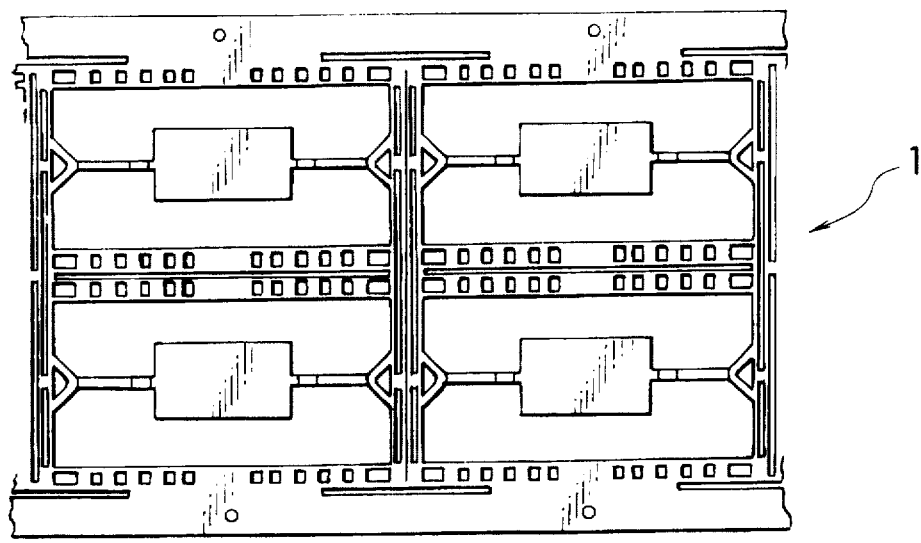
FIG. 30 is a plan view showing still another embodiment of the present invention.
Figure 31:
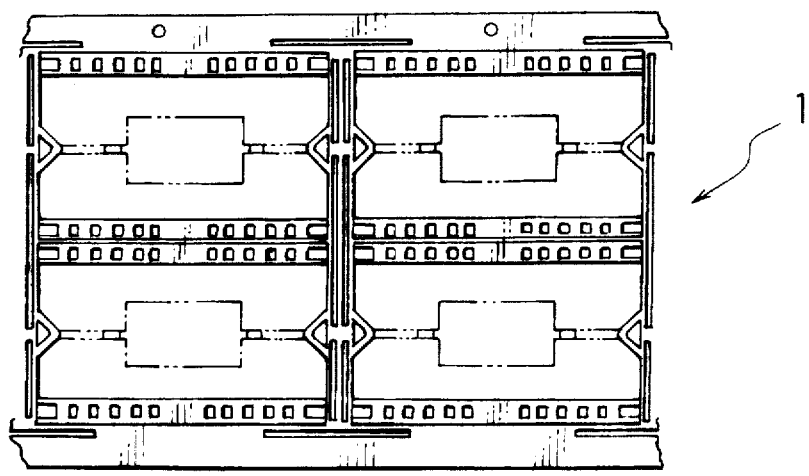
FIG. 31 is a plan view showing still another embodiment of the present invention.

FIG. 27 shows a case wherein slits according to the present invention are applied to the arrangement in FIG. 32 shown in Japanese Unexamined Patent Publication No. 2-273962 which has been described as prior art. With reference to FIGS. 27 and 32, the difference between thermal deformation absorbing slits can be described more obviously. FIG. 28 is a perspective view of FIG. 27, and FIG. 29 is a perspective view similarly showing another deformation. FIG. 30 shows an embodiment wherein slits according to the present application are formed in a matrix lead frame in which tab suspension leads are arranged parallel to the lead frame edges 1 and tabs are arranged in two lines. FIG. 31 shows another embodiment wherein slits according to the present application are formed in a matrix lead frame in which tab suspension leads are arranged parallel to the lead frame edges 1 and tabs are arranged in two lines. The case wherein the tab suspension leads are arranged parallel to the lead frame edges 1 is described as the embodiment in FIGS. 30 or 31. However, since the embodiments described in FIGS. 11 to 25 can also be applied to the above case, a description thereof will be omitted.

Embodiments of lead frames according to the present invention have been described above. A semiconductor device including part of a lead frame which is manufactured in such a manner as described above has high reliability with respect to heat.

As has been described above, in a lead frame according to the present invention, a slit is horizontally formed in a portion where a horizontal member having high rigidity is perpendicular to and connected to a vertical member in such a manner that the vertical member divides the slit by two. For this reason, when the vertical member is thermally deformed and displaced in the vertical direction, a low-rigidity portion obtained by partially dividing the horizontal member by the slit forms a both-end-fixed beam, and the thermal deformation of the vertical member is absorbed by the deformation of the beam. Therefore, since the deformation of the vertical member can be converted a displacement occurring within the plane of the lead frame, a highly accurate IC can be advantageously obtained.

In addition, in a semiconductor device including part of a lead frame which is manufactured in such a manner as described above, reliability with respect to heat is improved.

What is claimed is:

1. A lead frame comprising:
   a lead frame side extending in a longitudinal direction of said lead frame and a plurality of first slits in said lead frame side arranged end-to-end and extending in a direction parallel to the longitudinal direction and having a uniform interval and uniform width; and
   a plurality of second slits in said lead frame side arranged end-to-end parallel to the first slits, having a uniform interval and uniform width respectively equal to the interval and width of the first slits, and separated from the first slits by a distance equal to the width, wherein each end of each of the second slits is located near a center of a first slit.

2. A lead frame comprising:
a section bar transverse to a longitudinal direction of said lead frame and a plurality of first slits in said section bar arranged end-to-end and extending in a direction transverse to the longitudinal direction of said lead frame and having a uniform interval and uniform width; and
a plurality of second slits in said section bar arranged end-to-end and extending in a direction parallel to the first slits, having a uniform interval and uniform width respectively equal to the interval and width of the first slits, and separated from the first slits by a distance equal to the width, wherein each end of each of the second slits is located near a center of a first slit.

3. The lead frame according to claim 2 including lead frame sides parallel to the longitudinal direction, said section bar and said die pad suspension lead being connected to said lead frame side, and having a right-angle slit including a portion parallel to and in said lead frame side and a portion parallel to said section bar in said section bar.

4. A lead frame including a section bar, a die pad suspension lead, and a lead frame side extending in a longitudinal direction of said lead frame, wherein said section bar and said die pad suspension lead are connected to said lead frame side, a plurality of first slits in said lead frame side arranged end-to-end and extending in the longitudinal direction and having a uniform interval and uniform width, and a plurality of second slits in said lead frame side arranged end-to-end, parallel to the first slits and having a uniform interval and uniform width, respectively equal to the interval and width of the first slits, the first and second slits having respective ends, an end of a second slit being located near a center of a respective first slit, an end of a slit being located where said die pad suspension lead is connected to said lead frame side, and an end of a slit being located where said section bar is connected to said lead frame side.

5. A lead frame including lead frame sides, an intermediate support between and parallel to said lead frame sides, a plurality of section bars, a plurality of die pad suspension leads, said section bars and die pad suspension leads being connected to and transverse to said intermediate support between said lead frame sides, a plurality of first slits in said intermediate support, arranged end-to-end and parallel to a longitudinal direction of said lead frame, and a plurality of second slits in said intermediate support, arranged end-to-end, parallel to, and spaced from the first slits, the second slits being spaced at a uniform interval, the second slits being separated from the first slits by a uniform distance in said intermediate support, and each end of the second slits being located at a position near a center of a first slit.

6. The lead frame according to claim 5, wherein a third slit is located in each of said section bars in a direction perpendicular to the first and second slits.

7. The lead frame of claim 5 wherein the first and second slits have respective, equal widths and intervals, and the first slits are separated from the second slits by a distance equal to the widths.

8. A lead frame including lead frame sides, an intermediate support between and parallel to said lead frame sides, a plurality of section bars, a plurality of die pad suspension leads, said section bars and said die pad suspension leads being connected to and transverse to said intermediate support, at least two lines of slits in said intermediate support in a longitudinal direction thereof, and a slit perpendicular to the two lines of slits, between the two lines of slits in said intermediate support, and aligned with a cutting slit in said section bars.

9. A lead frame including lead frame sides, a die pad, a section bar, and a die pad suspension lead, said section bar and said die pad suspension lead being connected to said lead frame side, and having a slit partially perpendicular to said die pad suspension lead, in said die pad, the slit in said die pad being symmetrical with respect to said die pad suspension lead and having a portion perpendicular to said die pad suspension lead.

10. A lead frame including lead frame sides, a die pad, a section bar, and a die pad suspension lead, said section bar and said die pad suspension lead being connected to said lead frame side, two parallel slits perpendicular to said die pad suspension lead in said lead frame side, and including a slit perpendicular to said die pad suspension leads in said die pad, symmetrically located with respect to said die pad suspension lead.

11. A lead frame including lead frame sides, a die pad, a section bar, and a die pad suspension lead, said section bar and said die pad suspension lead being connected to said lead frame side, two parallel slits perpendicular to said die pad suspension lead in said section bar, and a slit perpendicular to said die pad suspension leads in said die pad symmetrically located with respect to said die pad suspension lead suspension lead.

12. A lead frame for a semiconductor device, said lead frame having a first member and a second member, perpendicular to said first member and including at least four portions, each portion intersecting said first member near a central portion of a slit in said first member, the second member being symmetrically disposed with respect to the central portion of the slit in the first member.

13. A lead frame for a semiconductor device, said lead frame having a first member and a second member, perpendicular to said first member and including at least four portions, said first member having T-shaped slits so that a slit in said second member is perpendicular to a slit in said first member near a central portion of a T-shaped slit in said first member.

14. The lead frame of claim 13 wherein the second member is symmetrically disposed with respect to the central portion of the T-shaped slit in the first member.

15. A lead frame for a semiconductor device, said lead frame having a first member and a second member, perpendicular to said first member and including at least two first portions and two second portions, each first portion intersecting said first member near a central portion of a slit in said first member, the first member also having a T-shaped slit, a slit in said second member being perpendicular to a T-shaped slit in said first member near a central portion of the T-shaped slit.

16. The lead frame of claim 15 wherein the first portions and the second portions of the second member are, respectively, symmetrically disposed with respect to the central portions of the slits in the first member.

17. A lead frame for a semiconductor device, said lead frame having a first member, a second member perpendicular to said first member and including a double slit having a length in said first member at an intersection of said first member and said second member, a first slit of the double slit being perpendicular to said second member near a central portion of the first slit, and a second slit of the double slit having one end located near where the first slit is perpendicular to said second member.

18. The lead frame of claim 17 wherein the second member is symmetrically disposed with respect to the central portion of the first slit in the first member.

* * * * *